(12) United States Patent
Namba et al.

(10) Patent No.: US 6,303,268 B1
(45) Date of Patent: Oct. 16, 2001

(54) RESIST RESIN, RESIST RESIN COMPOSITION AND METHOD OF FORMING PATTERN USING RESIST RESIN AND RESIST RESIN COMPOSITION

(75) Inventors: Yoichi Namba, Nagano; Hiroshi Takahashi, Chiba, both of (JP)

(73) Assignee: Showa Denko K.K., Tokyo (JP)

( * ) Notice: Subject to any disclaimer, the term of this patent is extended or adjusted under 35 U.S.C. 154(b) by 0 days.

(21) Appl. No.: 09/485,532

(22) PCT Filed: Aug. 12, 1998

(86) PCT No.: PCT/JP98/03589

§ 371 Date: Feb. 14, 2000

§ 102(e) Date: Feb. 14, 2000

(87) PCT Pub. No.: WO99/09457

PCT Pub. Date: Feb. 25, 1999

Related U.S. Application Data
(60) Provisional application No. 60/077,683, filed on Mar. 12, 1998, and provisional application No. 60/077,685, filed on Mar. 12, 1998.

(30) Foreign Application Priority Data

Aug. 14, 1997 (JP) .................................................. 9-219540
Feb. 19, 1998 (JP) .................................................. 10-37554

(51) Int. Cl.$^7$ .................................................. G03F 7/004
(52) U.S. Cl. .................................. 430/270.1; 430/286.1; 430/330; 430/322; 430/296; 430/942; 430/967; 522/172
(58) Field of Search .................. 430/270.1, 927, 430/281.1, 286.1, 322, 327, 330, 296, 966, 967, 942; 522/172; 523/107; 528/10

(56) References Cited

U.S. PATENT DOCUMENTS

| | | | |
|---|---|---|---|
| 6,087,064 | * 7/2000 | Lin et al. | 430/270.1 |
| 6,127,089 | * 10/2000 | Subramanian et al. | 430/270.1 |
| 6,210,856 | * 4/2001 | Lin et al. | 430/270.1 |
| 6,225,019 | * 5/2001 | Matsuda et al. | 430/270.1 |

FOREIGN PATENT DOCUMENTS

| | | |
|---|---|---|
| 2-309358 A | 12/1990 | (JP) . |
| 4-159553 A | 6/1992 | (JP) . |
| 4-338958 A | 11/1992 | (JP) . |
| 5-51458 A | 3/1993 | (JP) . |
| 5-72738 A | 3/1993 | (JP) . |
| 5-224421 A | 9/1993 | (JP) . |
| 06256445 | * 9/1994 | (JP) . |
| 6-256445 A | 9/1994 | (JP) . |
| 6-317907 A | 11/1994 | (JP) . |
| 8-92374 A | 4/1996 | (JP) . |
| 08092374 | * 4/1996 | (JP) . |
| 8-160623 | 6/1996 | (JP) . |
| 8-193167 A | 7/1996 | (JP) . |
| 9-2215519 | 8/1997 | (JP) . |
| 10-101801 A | 4/1998 | (JP) . |

OTHER PUBLICATIONS

International Search Report.

\* cited by examiner

*Primary Examiner*—Janet Baxter
*Assistant Examiner*—Yvette M. Clarke
(74) *Attorney, Agent, or Firm*—Sughrue, Mion, Zinn, Macpeak & Seas, PLLC

(57) ABSTRACT

A resist resin comprising a copolymer in which a (meth)acrylic structure having a side chain group decomposable with an acid and a polyorganosilsesquioxane structure represented by formula (1) are present in one molecule or a mixture of polymers in which these structures are each present in different molecules as well as a method of forming a pattern using the resist resin:

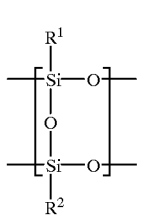

(1)

wherein a reference character or numeral represents the same meaning as recited in the specification.

The resist resin of the present invention has high sensitivity to a radiation having a short wavelength of 220 nm or less and is capable of forming a fine pattern of 0.15 μm or less.

18 Claims, No Drawings

RESIST RESIN, RESIST RESIN COMPOSITION AND METHOD OF FORMING PATTERN USING RESIST RESIN AND RESIST RESIN COMPOSITION

This application claims benefit of earlier applications based on U.S. Patent Application Ser. No. 60/077,683 (Filed: Mar. 12, 1998) and U.S. Pat. Application Ser. No. 60/077,685 (Filed: Mar. 12, 1998).

TECHNICAL FIELD OF THE INVENTION

The present invention relates to a resist resin and a resist resin composition which are highly sensible to light having a wavelength of 220 nm or less (such as ArF laser: 193 nm, $F_2$ laser: 157 nm, $Ar_2$ laser: 121 nm, soft X-ray: 13 nm or the like), an electron beam or X ray and also which are suitable for a fine processing technology capable of forming a pattern of 0.15 μm or less, as well as a method of forming the pattern using the resist resin composition.

BACKGROUND ART

In compliance with a recent increasing request for a highly dense package and high integration of a large scale integrated circuit (hereinafter referred to simply as "LSI"), it has become essential for a wiring pattern to be finely formed. One of the method of finely forming the wiring pattern is to utilize an exposure light source with a short wavelength to be for lithography. That is, an excimer laser (far ultraviolet ray such as KrF laser: 248 nm, ArF laser: 193 nm or the like, $F_2$ laser: 157 nm, Ar2 laser: 121 nm, soft X-ray: 13 nm or the like) which has a shorter wavelength than an ultraviolet ray such as g ray (436 nm), i ray (365 nm) or the like, an electron beam or an X ray has increasingly been utilized. In face, a mass production of the pattern utilizing an excimer laser source of 248 nm KrF excimer laser source has already started. Moreover, in a lithography technology of 0.15 μm or less corresponding to the design rule of 4 Gbit DRAM, it is essential to mass produce a lithography (ArF exposure technology) using 193 nm ArF laser source which has a shorter wavelength than 248 nm KrF laser. The ArF exposure technology has at first started with a monolayer resist process employing an organic alicyclic-based resist. However, since a problem such as a fall down of a pattern caused by surface tension of water with increase of aspect ratio at the time of wet development, an influence of a step on a substrate, decrease of focal depth or the like is generated in 0.13 μm or less, it has become difficult for the pattern to be formed with the conventional monolayer resist process.

In order to solve the above problems, a two-layer resist process for performing resolution of only the resist surface has been proposed and is anticipated to replace the conventional process rapidly. In the two-layer resist process, a material which is easily dry etched by oxygen plasma such as phenolic novolak resin, cresol novolak resin or the like is first applied by a spin coating method on the substrate followed by flattening a surface of the substrate; then the pattern is formed by means of a resist which is resistant to dry etching. Thereafter, the thus formed pattern is transfered to a lower layer by anisotropy etching by means of oxygen plasma. This process is performed under the dry development so that there exists no influence of surface tension of water whereupon the resist pattern having a high aspect ratio can be obtained without causing a fall down of a pattern. This two-layer resist process requires a resist material which is resistant to oxygen plasma etching. The resist material having a silicon atom is excellent in oxygen plasma resistance; for this reason, various resist materials having a silicon atom have heretofore been reported. Particularly, ladder-type polyorganosilsesquioxane has favorable characteristics such as high silicon content, excellent thermal stability, excellent oxygen plasma resistance and the like so that development of an Si-based resist material using this compound has been actively tried.

Moreover, high resolution corresponding to a processing size as well as sensitivity enhancement has increasingly been required for the resist material which undergoes LSI fine processing. This is because it is necessary for load put on a laser exposure device to be decreased in a manner that, since life of a source gas used for excimer laser oscillation is short and also light exposure resistance of a lens optical material is low, light energy to be incident on a projection optical system must be controlled and so forth.

As a method of sensitivity enhancement of the resist, a chemical amplified type resist which utilizes a light-causing acid generator that is one of sensitizers has been proposed. As an exemplary illustration, for example, a resist comprising a combination of triphenylsulfonium hexafluoroarsenate and poly-tert-butoxycabonatephenol is described in Examined Published Japanese Patent Application (Kokoku) (hereinafter referred to simply as "JPB") No. 2-27660 (U.S. Pat. No. 4,491,628, EP No. 102450). The chemical amplified type resist has already been practically produced in quantity as a resist for KrF excimer laser. The chemical amplified type resist is characterized in that a proton acid generated from an acid generator by means of exposure is diffusingly spread by performing post exposure bake (hereinafter referred to simply as "PEB") after the exposure thereby catalytically amplifying chemical reaction of the resist resin by several hundred to several thousand times.

In such way, photoreaction efficiency (reaction for one photon) of the chemical amplified type resist has increased thereby attaining the tremendous sensitivity enhancement over the conventional resist so that it has become essential for resists with a short wavelength after KrF excimer laser to adopt a chemical amplification mechanism.

Also as an Si-based resist material, a resist material which utilizes this chemical amplification mechanism has been proposed. For example, it has been reported that polyhydroxybenzylsilsesquioxane described in Unexamined Published Japanese Patent Application (Kokai) (hereinafter referred to simply as "JPA") No. 8-160620 (U.S. Pat. No. 5,612,170) comes to be a chemical amplified positive-type resist of by first protecting one of its hydroxyl groups with a tert-butoxycarbonyl group (hereinafter referred to simply as "t-BOC") and secondly combining the resultant resist with an acid generator.

However, this polyhydroxybenzylsilsesquioxane contains an aromatic ring which absorbs 193 nm ArF laser wavelength (when its coating thickness is 1 μm, transmission ratio being 60% or less) so that it is difficult for the compound to form a pattern with high sensitivity and high resolution as a resist for exposure with light having a wavelength of 193 nm or less.

On the other hand, as an example of an Si-based resist material which does not contain an aromatic ring, ethylcarboxylpolysilsesquioxane has been proposed (JPA-5-323611). This ethylcarboxylpolysilsesquioxane can be obtained by performing hydrolysis condensation of hydrosilylated tert-butyl methacrylate under an alkali catalyst. However, all carboxyl groups of side chains are protected (with t-BOC) so that it is difficult to enhance its sensitivity unless a large number of protected groups are decomposed in order to render its exposured portion soluble to an alkali developer. Even if a large number of the protected groups should be decomposed, it has a disadvantage that hardening compressive stress of a resist coating is increased whereupon a crack or separation may occur. Therefore, it can not be a resist material suitable for fine processing.

As another example, polyhydroxycarbonylethyl-silsesquioxane has also been proposed (JPA-8-160623). However, in this polyhydroxycarbonylethyl-silsesquioxane, though a portion of carboxylic groups of side chains is protected with a tert-butyl, t-BOC, tetrahydro-pyranyl group or the like, protection ratio at this time is as low as 10 to 25% so that quantity of carboxylic acids existing in its unexposed portion is large, which causes its solubility to the alkali developer is too high. Moreover, it is difficult to raise the protection ratio. For this reason, if a standard developer, namely, an agueout solution of 2.38% tetramethylammonium hydroxide (hereinafter referred to simply as "TMAH") is used, a developing characteristic is bad. There exists a disadvantage that the pattern resolution can not be performed unless it is used after diluted by about 20 times. Therefore, it, in fact, is difficult to practically adopt it to a mass production process.

Recently, an Si-containing acrylic copolymer has been proposed in JPA-9-110938 (EP No. 758102). This comprises a terpolymer (copolymer) containing an acrylic monomer having a group decomposable with an acid such as a tert-butyl, t-BOC group or the like and another acrylic monomer having a siloxane portion such as methacryloxypropyltris(trimethylsiloxane)silane or the like. However, these copolymers have introduced a siloxane structure as the Si portion so that it is difficult to raise Si content in the resist resin. Hence, an etching rate with a selection ratio of 10 or more which is an indicator of oxygen plasma resistance required for the Si resist can not be achieved.

Moreover, there exists a disadvantage such that, since the siloxane portion, is highly hydrophobic, it has a low wettability to a 2.38% TMAH developer whereupon a paddle-type development device which performs development by placing the developer on a wafer while keeping it still thereon can not be employed. The paddle-type development device consumes a relatively small quantity of developer as well as effectively reduces a resist residue and tailing so that it has primarily been employed in developing a positive-type photoresist in recent years; hence, it is difficult for this resist to be commercially mass produced.

Therefore, a novel material that is an Si-based resist material of chemical amplified type, does not absorb light with a wavelength of 193 nm or less, is adaptable to the 2.38% TMAH developer, has a good oxygen plasma resistance and does not produce a problem such as pattern insolubilization, swelling or the like has seriously been desired.

OBJECT OF THE INVENTION

In view of the above problems of the known art, the present invention is to provide a polysilsesquioxane-based chemical amplified type resist material which is favorable as an Si-based resist material for light with a wavelength of 220 nm or less (ArF laser: 193 nm, F$_2$ laser: 157 nm, Ar2 laser: 121 nm, soft X-ray: 13 nm or the like), an electron beam or an X ray and which is also excellent in process adaptability due to its high sensitivity and high resolution.

SUMMARY OF THE INVENTION

As a result of an intensive study on a polysilsesquioxane-based chemical amplified type resist material, the present inventors have found that a resin or a resin composition comprising a copolymer in which an acrylic or methacrylic (hereinafter referred to simply as "(meth)acrylic" in cases) structure having a side chain group decomposable with an acid (specifically, a side chain group having a tert-butyl, t-BOC, trimethylsilyl, tetrahydropyranyl, ethoxyethyl ester or the like of an organic acid such as carboxylic acid, sulfonic acid or the like) and a polyorganosilsesquioxane structure having a side chain containing a functional group selected from a group consisting of alkyl or vinyl, epoxy, amino, acryl(acrylic), methacryl (methacrylic) and mercapto groups, preferably with an terminal silanol group being endcapped, are present in one molecule or a mixture of polymers in which these structures are each present in different molecules have high sensitivity and high resolution as well as excellent oxygen plasma resistance as a resist resin for being exposed to light with a short wavelength of 220 nm or less and thus have achieved the present invention.

Namely, the present invention relates to resist resins, resist resin compositions and methods of forming a pattern as follows:

1) A resist resin comprising
a copolymer in which a polyorganosilsesquioxane structure and a (meth)acrylic-based polymer structure having a side chain decomposable with an acid to generate an organic acid group are present in one molecule, or
a mixture of (co)polymers in which said structures are each present in different molecules,
wherein the polyorganosilsesguioxane structure is represented by formula (1):

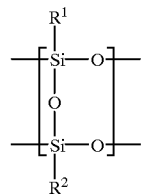

(1)

wherein $R^1$ and $R^2$, which may be the same or different, each represent a hydrocarbon group having 1 to 10 carbon atom(s) which may be substituted with a (meth) acryloyloxy, vinyl, amino, epoxy or mercapto group, said (meth)acryloyloxy and vinyl group may form (meth)acrylic-based or vinyl-based polymer structures respectively, and a plurality of $R^1$ or $R^2$ present in the same molecule may be different from each other.

2) The resist resin as described in 1) above, comprising a copolymer comprising a (meth)acrylic- or vinyl-based polymer structure derived from a group represented by formula (2):

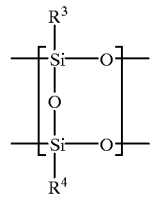

(2)

wherein $R^3$ and $R^4$ represent the same meaning as the $R^1$ and $R^2$ described in 1) above respectively, and at least one of R³ and R⁴ represents a hydrocarbon group having 1 to 10 carbon atom(s) substituted with a (meth)acryloyloxy or vinyl group, and a (meth)acrylic-based polymer structure having a side chain decomposable with an acid to generate an organic acid group.

3) The resist resin as described in 2) above, wherein said copolymer comprises the (meth)acrylic- or vinyl-based polymer structure derived from the formula (2), a (meth)acrylic polymer structure represented by formula (3):

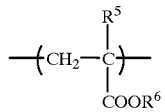
(3)

wherein $R^5$ represents a hydrogen atom or a methyl group and $R^6$ represents a group decomposable with an acid, and a (meth)acrylic polymer structure represented by formula (4):

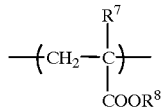
(4)

wherein $R^7$ represents a hydrogen atom or a methyl group and $R^8$ represents a hydrogen atom or an alkyl group having 1 to 10 carbon atom(s).

4) The resist resin as described in 3) above, wherein said copolymer comprises 1 to 50 mol % of a (meth)acrylic- or vinyl-based polymer structure derived from the group represented by the formula (2), 10 to 90 mol % of the (meth)acrylic-based polymer structure represented by the formula (3), 1 to 90 mol % of the (meth)acrylic-based polymer structure represented by the formula (4) and 50 mol % or less of a polymer structure represented by formula (5):

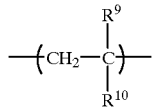
(5)

wherein $R^9$ represents a hydrogen atom or a methyl group and $R^{10}$ represents an organic, a hydroxyl, a sulfonic acid group or a halogen atom.

5) The resist resin as described in any one of 2) to 4) above, wherein 0.1 mol % or more of silanol terminals of a polymer structure derived from a group represented by the formula (2) is endcapped.

6) The resist resin as described in 5) above, wherein 50 mol % or more of silanol terminals of a polymer structure derived from the group represented by the formula (2) is endcapped.

7) The resist resin as described in any one of 2) to 6) above, wherein the (meth)acrylic- or vinyl-based polymer structure derived from the group represented by the formula (2) comprises a ladder structure having a partially branched structure represented by formula (6):

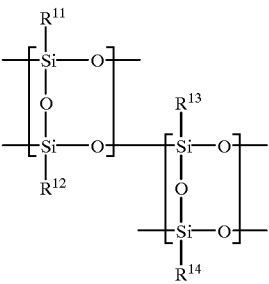
(6)

wherein $R^{11}$, $R^{12}$, $R^{13}$ and $R^{14}$ represent the same meaning as $R^1$ and $R^2$ described in 1) above and at least one of $R^{11}$, $R^{12}$, $R^{13}$ and $R^{14}$ represents a hydrocarbon group having 1 to 10 carbon atom(s) substituted by a (meth)acryloyloxy or vinyl group.

8) The resist resin as described in 1) above, comprising a mixture of polyorganosilsesquioxane having the structure represented by the formula (1) and a (co)polymer comprising a (meth)acrylic-based polymer structure having a side chain group decomposable with an acid to generate an organic acid group.

9) The resist resin as described in 8) above, comprising a mixture of a polyorganosilsesquioxane having the structure represented by the formula (1), a (meth)acrylic-based polymer structure represented by formula (7):

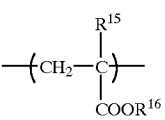
(7)

wherein $R^{15}$ represents a hydrogen atom or a methyl group and $R^{16}$ represents a group which is decomposable with an acid, and a (meth)acrylic-based polymer structure represented by formula (8):

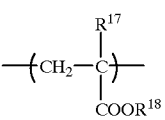
(8)

wherein $R^{17}$ represents a hydrogen atom or a methyl group and $R^{18}$ represents a hydrogen atom or an alkyl group having 1 to 10 carbon atom(s).

10) The resist resin as described in 9) above, wherein said copolymer comprises 10 to 90 mol % of the (meth)acrylic-based polymer structure represented by the formula (7), 1 to 90 mol % of the (meth)acrylic-based polymer structure represented by the formula (8) and 50 mol % or less of a polymer structure represented by formula (9):

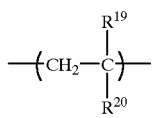

(9)

wherein $R^{19}$ represents a hydrogen atom or a methyl group and $R^{20}$ represents an organic, a hydroxyl, a sulfonic acid group or a halogen atom.

11) The resist resin as described in 10) above, wherein the polymer structure represented by said formula (9) comprises 100 mol % or less of a (meth)acrylic-based or vinyl-based polymer structure derived from a group represented by formula (10):

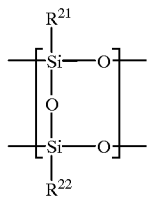

(10)

wherein $R^{21}$ and $R^{22}$ represent the same meanings as $R^1$ and $R^2$ described in 1) above respectively and at least one of $R^{21}$ and $R^{22}$ represents a hydrocarbon group having 1 to 10 carbon atom(s) substituted by a (meth) acyloyloxy or vinyl group.

12) The resist resin as described in any one of 8) to 11) above, wherein 0.1 mol % or more of silanol terminals of polyorganosilsesquioxane having the structure represented by the formula (1) and the polymer structure derived from the group represented by the formula (10) are endcapped.

13) The resist resin as described in 12) above, wherein 50 mol % or more of silanol terminals of polyorganosilsesquioxane, having the structure represented by the formula (1) and the polymer structure derived from the group represented by the formula (10) are endcapped.

14) The resist resin as described in any one of 8) to 13) above, wherein polyorganosilsesquioxane having the structure represented by the formula (1) comprises a ladder structure having a partially branched structure represented by formula (11):

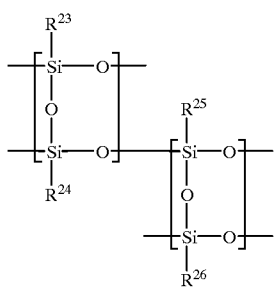

(11)

wherein $R^{23}$, $R^{24}$, $R^{25}$ and $R^{26}$ represent the same meanings as $R^1$ and $R^2$ described in 1) above.

15) The resist resin as described in any one of 1) to 14) above, wherein silicon (Si) content rate is 1 to 30 wt %.

16) A resist resin composition comprising a resist resin as described in any one of 1) to 15) above and a light-causing acid generator decomposable by exposure of light having a wavelength of 220 nm or less, an electron beam or X-ray to generate an acid.

17) A method of forming a pattern on a substrate to be processed comprising the steps of:
  forming a resist layer comprising the resist resin composition as described in 16) above on the substrate to be, processed;
  performing a preheating operation;
  performing exposure of light having a wavelength of 220 nm or less, an electron beam or X-ray via photomask;
  performing a heating operation; and
  performing development.

18) A method of forming a pattern comprising the steps of:
  forming an organic polymer compound on a substrate to be processed as a lower layer resist;
  constructing a two-layer structure by forming the resist resin composition as described in 16) above on said lower layer resist as a upper layer resist;
  exposing said upper layer resist with light having a wavelength of 220 nm or less, an electron beam or X-ray via photomask;
  performing a heating operation;
  performing development; and
  performing etching using the upper layer resist-pattern as a mask so as to transfer to the lower layer resist.

DETAILED DESCRIPTION OF THE INVENTION

The present invention will now be described in detail below.

A resist resin of the present invention comprises
  a copolymer in which a polyorganosilsesquioxane structure and a (meth)acrylic-based polymer structure having a side chain decomposable with an acid to generate an organic acid group are present in one molecule, or
  a mixture of (co)polymers in which said structures are each present in different molecules,
wherein the polyorganosilsesquioxane structure is represented by formula (1):

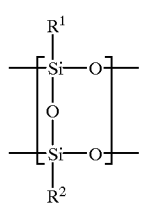

(1)

wherein $R^1$ and $R^2$, which may be the same or different, each represent a hydrocarbon group having 1 to 10 carbon atom(s) which may be substituted with a (meth) acryloyloxy, vinyl, amino, epoxy or mercapto group, said (meth)acryloyloxy and vinyl group may form (meth)acrylic-based or vinyl-based polymer structures respectively, and a plurality of $R^1$ or $R^2$ present in the same molecule may be different from each other.

Namely, the resist resin of the present invention comprises a resist resin comprising the following copolymer (A) or a mixture of (co)polymers (B).

(A) A copolymer comprising a (meth)acrylic- or vinyl-based polymer structure derived from a group represented by formula (2):

(2)

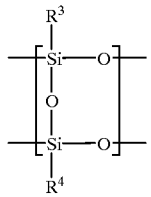

wherein $R^3$ and $R^4$ represents the same meanings as the above-described $R^1$ and $R^2$ respectively, and at least one of $R^3$ and $R^4$ represents a hydrocarbon group having 1 to 10 carbon atom(s) substituted with a (meth)acryloyloxy or vinyl group, that in the polyorganosilsesquioxane structure of the formula (1) at least one of $R^1$ and $R^2$ is a hydrocarbon group having 1 to 10 carbon atom(s) substituted by a (meth)acryloyloxy or vinyl group; and a (meth)acrylic-based polymer structure having a side chain decomposable with an acid to generate an organic acid group are present in one molecule.

(B) A mixture comprising the polyorganosilsesquioxane having the structure of the formula (1) and the (co)polymer having a (meth)acrylic-based polymer structure having a side chain decomposable with an acid to generate an organic acid group.

(I) Polyorganosesquioxane Structure

Hydrocarbon group having 1 to 10 carbon atom(s) of $R^1$, $R^2$, $R^3$ and $R^4$ in the formulae (1) and (2) represents alkyl, aralkyl, aryl, or alicyclic hydrocarbon group such as cyclohexyl, norbornyl group or the like, preferably an alkyl group such as a methyl, ethyl, propyl, butyl group or their isomeric groups.

When each of $R^1$, $R^2$, $R^3$ or $R^4$ represents a hydrocarbon group having 1 to 10 carbon atom(s) substituted by a (meth)acryloyloxy or vinyl group, the (meth)acryloyloxy group may form a (meth)acrylic-based polymer structure derived therefrom, and the vinyl group may form a vinyl-based polymer structure derived therefrom.

Polyorganosilsesquioxane structures represented by formulae (1) and (2) preferably have a polyorganosilsesquioxane structure comprising a partially branched ladder structure as represented by formulae (6) and (11):

(6)

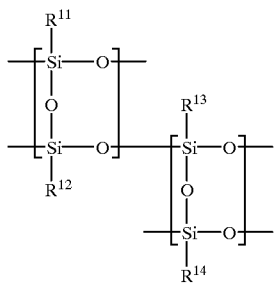

(11)

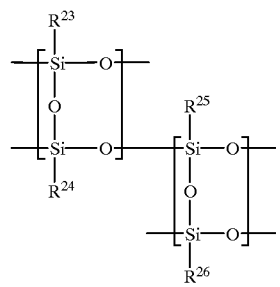

wherein $R^{11}$, $R^{12}$, $R^{13}$, $R^{14}$, $R^{23}$, $R^{24}$, $R^{25}$ and $R^{26}$ show the same meanings as $R^1$ and $R^2$ above, and at least one of $R^{11}$, $R^{12}$, $R^{13}$ and $R^{14}$ represents a hydrocarbon group having 1 to 10 carbon atom(s) substituted by a (meth)acryloyloxy or vinyl group.

By having such structures described above, cross-linking density increases, so that thermal resistance and plasma resistance are favorably enhanced.

Particularly, it is preferable that the structures have a partially branched structure represented by formula (12), (13) or (14).

Formula (12):

(12)

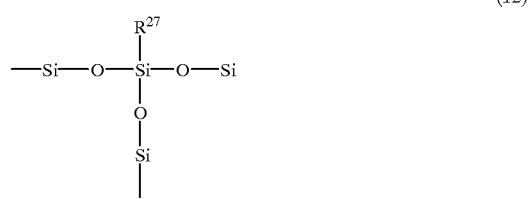

wherein $R^{27}$ represents the same meaning as $R^1$ above.

Formula (13):

(13)

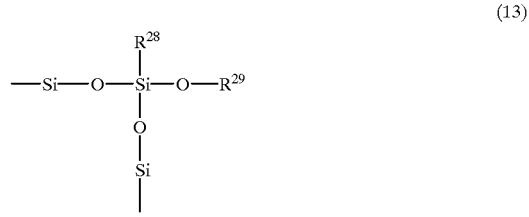

wherein $R^{28}$ represents the same meaning as $R^1$ above and $R^{29}$ represents a hydrogen atom or an alkyl group having 1 to 4 carbon atom(s).

Formula (14):

(14)

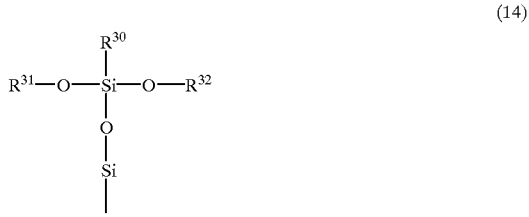

wherein $R^{30}$ represents the same meaning as $R^1$ above, and $R^{31}$ and $R^{32}$ each, independently represent a hydrogen atom or an alkyl group having 1 to 4 carbon atom(s).

When polyorganosilsesquioxane having the structure represented by formula (1) comprises only a ladder structure, hydrophobicity of the resist coating film becomes so strong that its wettability to the developer is deteriorated. On the other hand, when it comprises only the branched structure, Tg is decreased so that oxygen plasma resistance comes to be insufficient. The partially branched structures are confirmed by measuring $^{29}$Si-NMR and comparing with a chemical shift described in the reference (Journal of Applied Polymer Science, Vol. 34, 1987, pages 1631–1644).

(II) Preparation of a Compound Having a Polyorganosilsesquioxane Structure

Polyorganosilsesquioxane having the structure of formula (1) or (2) can be prepared by a method such as hydrolytically condensation of trialkoxysilane having a hydrocarbon substituent having 1 to 10 carbon atom(s) or trialkoxysilane having a hydrocarbon substituent having 1 to 10 carbon atom(s) substituted by at least one functional group selected from (meth)acryloyloxy, vinyl, epoxy or mercapto group under water and an acid catalyst.

As examples of materials for synthesis of polyorganosilsesquioxane having the structure represented by the formula (1) of the present invention, following alkoxysilane monomers are illustrated:

As trialkoxysilane having a hydrocarbon substituent having 1 to 10 carbon atom(s), methyltrimethoxysilane, methyltriethoxysilane, methyltributoxysilane, ethyltrimethoxy silane, ethyltriethoxysilane, ethyltributoxysilane, propyltrimethoxysilane, propyltriethoxysilane, propyltributoxysilane, butyltrimethoxysilane, butyltriethoxysilane, butyltributoxysilane and the like are illustrated. They can be used individually or in any combination of any two or more thereof.

As trialkoxysilane having a hydrocarbon substituent having 1 to 10 carbon atom(s) substituted by at least one functional group selected from (meth)acryloyloxy, vinyl, epoxy amino or mercapto group, γ-acryloyloxypropyltrimethoxysilane, γ-methacryloyloxypropyltrimethoxysilane, γ-acryloyloxypropyltriethoxysilane, γ-methacryloyloxypropyltriethoxysilane, vinyltrimethoxysilane, vinyltriethoxysilane, vinyltributoxysilane, allyltrimethoxysilane, allyltriethoxysilane, γ-glycidyloxypropyltrimethoxysilane, γ-glycidyloxypropyltriethoxysilane, γ-aminopropyltrimethoxysilane, γ-aminopropyltriethoxysilane, γ-mercaptopropyltrimethoxysilane, γ-mercaptopropyltriethoxysilane and the like are illustrated. These are used individually or in any combination of any two or more thereof.

A ratio of trialkoxysilane having at least one functional group selected from (meth)acryloyloxy, vinyl, epoxy, amino or mercapto group against trialkoxysilane having a hydrocarbon substituent having 1 to 10 carbon atom(s) to be used at preparing the polyorganosilsesquioxane having the structure of formula (1) or (2) is 50 mol % or less, preferably 5 to 20 mol %. If the ratio exceeds 50 mol %, since a vinyl, epoxy, amino, (meth)acryloyloxy group or the like has absorptivity in a range of 200 nm or less of wavelength, exposure sensitivity will be reduced.

A quantity of water to be used for a condensation reaction is preferably 0.5 to 5.0 times more in terms of mol than the mol number of raw material alkoxysilane. If the quantity of water is less than 0.5 times in terms of mol, hydrolysis will not proceed satisfactorily. On the other hand, if the quantity of water exceeds 5.0 times in terms of mol, an irregular three dimensional condensation reaction occurs whereupon it is difficult for polyorganosilsesquioxane comprising a ladder structure having a partially branched structure which is an object of the present invention to be obtained.

A quantity of acid catalyst to be used for the condensation reaction is preferably in a range of 0.1 to 1,000 ppm. If the quantity of the acid catalyst is less than 0.1 ppm, hydrolytic condensation will not proceed satisfactorily. On the other hand, if the acid catalyst is used more than 1,000 ppm, the hydrolytic condensation reaction will occur rapidly to form gel whereupon synthesis can not be performed In a consistent manner.

As reaction conditions for synthesizing polyorganosilsesquioxane having the structure represented by the formula (1), a reaction temperature is 20 to 100° C. and a reaction time is 1 to 24 hours. In order to carry out the reaction efficiently for obtaining polyorgaonsilsesquioxane having a partially branched structure, it is preferable that the reaction is performed for 2 to 10 hours at 70 to 100° C., for example, under a total reflux condition. The condensation reaction can be ceased by decreasing the reaction temperature or by neutralizing a reaction solution. Any salt to be generated at the time can be removed by filtration, rinsing or any other suitable method.

Preferably 0.1 mol % or more, more preferably 50 mol % or more, of a terminal silanol group of polyorganosilsesquioxane having the structure represented by formula (1) or (2) is endcapped. By performing such endcapping, storage stability and positive-type development characteristic are favorably enhanced.

The endcapping can be performed by reacting a polyorganosilsesquioxane solution after condensation with an endcapping agent under an acidic atmosphere. The reaction by the endcapping agent is performed by dosing one or more kinds of endcapping agents at a time or two or more times. The endcapping agent is preferably what does not contain halosilane and is not likely to be influenced by an excess amount of water used for hydrolysis or what itself becomes an endcapping agent after being hydrolyzed under an acidic atmosphere and also, in either case described above, what does not render hydrophobicity of polyorganosilsesquioxane after endcapped to be extremely strong. Moreover, a combination of a hydrophilic endcapping agent and a hydrophobic endcapping agent may be used.

Exemplary illustrations of endcapping agents include 1,3-bis(hydroxypropyl)tetramethyldisiloxane, 1.3-bis (hydroxybutyl)tetramethyldisiloxane, 1,3-bis(aminopropyl) tetramethyldisiloxane, 1,3-bis(glycidyloxypropyl) tetramethyldisiloxane, 1,3-bis(methacryloyloxypropyl) tetramethyldisiloxane, hexamethyldisiloxane, hexamethyldisilazane, 1,3-divinyltetramethyldisiloxane and the like but are not limited to the above. They may be used individually or in any combination of any two or more thereof.

When endcapping reaction is performed by using the above endcapping agents, a two-stage endcapping reaction is preferably adopted in a manner that firstly a reaction using especially 1,3-bis(hydroxypropyl)tetramethyldisiloxane is performed and then hexamethyldisilazane is dosed to the thus produced reaction product to reduce remaining terminal groups.

Reaction conditions of the endcapping reaction are that reaction temperature is 50 to 100° C. and reaction time is 1 to 8 hours but that they are changeable in accordance with the desired endcapped ratio and the kind of solvent to be used.

(III) Acrylic-based Polymer Structure Having a Side Chain Group Decomposable with an Acid to Generate an Organic Acid Group The resist resin of the present invention comprises the polyorganosilsesquioxane structure represented by the above formula (1) and an acrylic-based polymer structure having a side chain group decomposable with an acid to generate an organic acid group.

The side chain group decomposable with an acid to generate an organic acid group is a side chain group that is decomposed to generate an organic acid group such as a carboxylic, sulfonic acid group or the like under the reaction condition of the present invention.

Specifically, it is a side chain group having a tert-butyl, trimethylsilyl, tetrahydropyranyl or ethoxyethyl ester or the like of the above-described organic acid groups. Moreover, a side chain group represented by the following formula is also preferable:

—COO—T—COOR' wherein T represents a bivalent hydrocarbon group having 1 to 20 carbon atom(s) which may have a substituent or a bivalent hydrocarbon group having 7 to 13 carbon atom(s) containing a bridged cyclic hydrocarbon group and R' represents an acid-decomposable group such as a tert-butyl, tetrahydropyranyl, tetrahydrofuranyl, trimethylsilyl, methoxyethyl, ethoxyethyl, propoxyethyl, butoxyethyl or 3-oxocyclohexyl group.

In the above formula, exemplary illustrations of bivalent hydrocarbon group T include methylene, ethylene, n-propylene, cyclohexylene or phenylene groups, as well as a tricyclodecan-diyl, norbornan-diyl, adamantan-diyl group described in JPA-9-221519, or the like.

In the present invention, the acid is a substance which has a hydrogen atom and can liberates a hydrogen ion (H+) in a solution. In the present invention, the acid generated from a compound (acid generator) which will generate an acid when exposed to radiation especially such as an ultraviolet ray, electron beam, X ray or the like.

As a preferable acrylic-based polymer structure having a, side chain group decomposable with an acid to generate an organic acid group, a polymer structure derived from a tert-butyl, tetrahydropyranyl, tetrahyrofuranyl, trimethylsilyl, methoxyethyl, ethoxyethyl, propoxyethyl, butoxyethyl, 3-oxocyclohexyl ester or the like of acrylic or methacrylic acid is illustrated.

(IV) Copolymer-based Resist Resin

In the resist resin of the present invention, the copolymer in which the polyorganosilsesquioxane structure of formula (1) above and an acrylic-based polymer structure having a side chain group decomposable with an acid to generate an organic acid group are present in one molecule is a copolymer comprising a polymer structure having a (meth)acryloyloxy or vinyl group, which is derived from a (meth)acrylic-based, or vinyl-based monomer represented by formula (2):

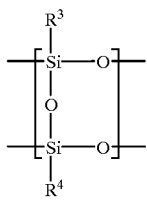

(2)

wherein $R^3$ and $R^4$ represent the same meanings as the above-described $R^1$ and $R^2$ respectively, and at least one of $R^3$ and $R^4$ represents a hydrocarbon group having 1 to 10 carbon atom(s) substituted with a (meth)acryloyloxy or vinyl group, and a (meth)acrylic-based polymer structure having a side chain decomposable with an acid to generate an organic acid group represented by formula (3):

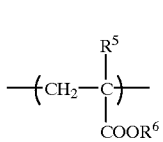

(3)

wherein $R^5$ represents a hydrogen atom or a methyl group and $R^6$ represents a group decomposable with an acid.

A (meth)acrylic-based or vinyl-based monomer represented by formula (2) for introducing the above-described polyorganosilsesquioxane structure is a compound having a ratio of less than 50 mol %, preferably 5 to 20 mol % of alkyl groups substituted by a (meth)acyloyloxy or vinyl group against total $R^3$ and $R^4$.

Molecular weight of the compound is obtained as a value in terms of polystyrene measured with gel permeation chromatography (GPC). At that time, a number average molecular weight (Mn) is 300 to 3,000, preferably 500 to 2,000. Weight average molecular weight (Mw) is 500 to 9,000, preferably 600 to 5,000. If Mn is less than 300 or Mw is less than 500, polyorganosilsesquioxane comprising a partially branched structure having a ladder structure is not formed whereupon it is difficult for a desired plasma resistance to be obtained. If Mn exceeds 3,000 or Mw exceeds 9,000, the hydrophobicity of a resist film becomes strong to cause a problem of separation, forming a residue or the like at the time of developing.

As a (meth)acrylic-based monomer for introducing a (meth)acrylic-based polymer structure represented by the formula (3), exemplary illustrations include tert-butyl acrylate, tert-butyl methacrylate (TBMA), 1,1-dimethylbenzyl acrylate, 1,1-dimethylbenzyl methacrylate, tert-butoxycarbonyl carbonyl acrylate, tert-butoxycabonyl methacrylate, tetrahydropyranyl acrylate, tetrahydropyranyl methacrylate (THPMA), ethoxyethyl acrylate, ethoxyethyl methacrylate and the like. These can be used individually or in any combination of any two or more thereof.

This copolymer can comprise another (meth)acrylic-based polymer structure. As another polymer structure, the polymer structure represented by the formula (4) is illustrated:

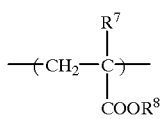

(4)

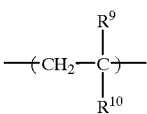

(5)

wherein $R^7$ represents a hydrogen atom or a methyl group and $R^8$ represents a hydrogen atom or an alkyl group having 1 to 10 carbon atom(s).

As a (meth)acrylic-based monomer for introducing a (meth)acrylic-based polymer structure represented by the formula (4), for example, acrylic acid, methacrylic acid, methyl acrylate, methyl methacrylate, ethyl acrylate, ethyl metacrylate, n-butyl acrylate, n-butyl methacrylate or the like can be illustrated. These can be used individually or in any combination of any two or more thereof.

A (meth)acrylic-based copolymer comprising one or more of these polymer structures may be a random copolymer, a block copolymer or a random copolymer comprising a block copolymer partially.

A ratio of (meth)acrylic-based polymer structure represented by the formula (2) in the above-described copolymer is preferably 1 to 50 mol % against the total copolymer structure (100 mol %). Specifically, copolymerization is performed in a manner that silicon (Si) content in the resist resin originated from a (meth)acrylic-based or vinyl-based polymer structure represented by the formula (2) is 1 to 30 wt %, preferably 5 to 20 wt %. If the silicon (Si) content is less than 1 wt %, plasma resistance of the resist film at the time of dry etching is insufficient. If the silicon (Si) content is over 30 wt %, enhancement of dry etching resistance can not be expected by such content increase.

A ratio of (meth)acrylic-based polymer structure represented by the formula (3) against the total copolymer structure (100 mol %) is 10 to 90 mol %, preferably 30 to 70 mol % in terms of a copolymeric ratio basis. If the copolymer ratio is less than 10 mol %, a difference of its solubility in an alkali developer between before and after exposures is small so that a sufficient contrast can not be obtained. If the ratio is more than 90 mol %, further increase of contrast can not be expected by such copolymer ratio increase.

A ratio of (meth)acrylic-based polymer structure represented by the formula (4) is preferably 1 to 90 mol % against the total copolymer structure (100 mol %). Particularly, a ratio of polymer structure in which $R^8$ in the formula (4) represents the hydrogen atom is preferably 1 to 50 mol %, more preferably 10 to 30 mol %. If a ratio of the above-described polymer structure is less than 1 mol %, adhesiveness to a silicon substrate is insufficient; while if it exceeds 50 mol %, an unexposed portion dissolves in an alkali developer whereupon a desired characteristic as a positive-type resist can not be obtained. A ratio of polymer structure in which $R^8$ In the formula (4) represents an alkyl group is preferably 90 mol % or less, more preferably 10 to 60 mol %. If a ratio of the above-described polymer structure is more than 90 mol %, the group decomposable with an acid represented by formula (3) becomes less than 10 mol % whereupon a sufficient contrast as a resist can not be obtained.

Optionally, a polymer structure represented by a formula (5):

wherein $R^9$ represents a hydrogen atom or a methyl group and $R^{10}$ represents an organic group such as a hydrocarbon group that may have a substituent, a substituted carbonyl group, a carboxylic acid ester group, carboxylic acid amide group, nitrile group, alkoxy group, a sulfonic acid ester group or the like, or a hydroxyl group, a sulfonic acid group or a halogen atom, may be comprised up to 50 mol %.

When the formula (5) shows a (meth)acrylic-based polymer structure, as a (meth)acrylic-based monomer for introducing the (meth)acrylic-based polymer structure, for example, lauryl acrylate, lauryl methacrylate, cyclohexyl acrylate, cyclohexyl methacrylate, isobornyl acrylate, isobornyl methacrylate, 2-ethyhexyl acrylate, 2-ethylhexyl methacrylate, adamantyl acrylate, adamantyl methacrylate, tricyclodecanyl acrylate, tricyclodecanyl methacrylate or the like is illustrated. These can be used individually or in any combination of any two or more thereof.

Optionally, as a vinyl compound which is capable of copolymerizing with the above-described monomer, for example, styrene, vinyltoluene, α-methylstyrene, acrylonitrile, acrylamide, methacrylamide, 2-acrylamide-2-methylpropanesulfonic acid or its esters, vinylacetate, vinylchloride or the like is illustrated. They can be used individually or in any combination of any two or more thereof.

The copolymer of the present invention can be prepared by copolymerizing the above-described polymerizable monomer under a radical polymerization initiator. As the radical polymerization initiator, for example, benzoyl peroxide, methy ethyl ketone peroxide, azobisisobutyronitrile, azobisdimethyldibutylate, cumene hydroperoxide, tert-butyl hydroperoxide or the like is illustrated. These can be used individually or in any combination of any two or more thereof.

In order to control a molecular weight at the time of the above polymerization, optionally a chain transfer agent can be used simultaneously. As the chain transfer agent, a mercaptide compound (R—SH), a disulfide compound (R—S—S—R) (R generally represents a hydrocarbon group, preferably a long chain alkyl group), a polyhalogen compound (for example, $CCl_4$) and so forth can be illustrated.

In this case, reaction conditions are, for example, reaction temperature of 50 to 100° C. and reaction time of 1 to 10 hours. They may be changed in accordance with kind of polymerizable monomer, kind of solvent, solid content at the time of polymerization, kind of polymerization initiator, kind of chain transfer agent or the like which is to be used in the reaction.

The molecular weight of the obtained copolymer is 500 to 10,000, preferably 1,000 to 3,000 as number average molecular weight (Mn) in terms of polystyrene, as well as 1,000 to 30,000, preferably 2,000 to 10,000 as weight average molecular weight (Mw) in terms of polystyrene. If Mn is less than 500 or Mw is less than 1,000, then an unexposed portion dissolves in an alkali solution so that a desired resolution characteristic can not be obtained. If Mn exceeds 10,000, or Mw exceeds 30,000, hydrophobicity of a resist film becomes strong whereupon a problem such as separation, generation of a residue or the like occurs.

(V) Mixture-typed Resist Resin

A (co)polymer mixture of resist resin of the present invention in which the polyorganosilsesquioxane structure represented by formula (1) above and the (meth)acrylic-based polymer structure having a side chain group decomposable with an acid to generate an organic acid group are each present in different molecules is a mixture of (co)polymers which comprise a polyorganosilsesquioxane having the structure represented by the formula (1) and a (meth)acrylic-based polymer having a side chain group decomposable with an acid to generate an organic acid group.

As the polyorganosilsesquioxane having a structure represented by the formula (1) which is used in the mixture-based resist resin, for example, what is represented by formula (15):

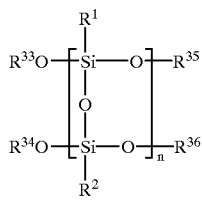

(15)

wherein $R^{33}$, $R^{34}$, $R^{35}$ and $R^{36}$ each represent an alkyl group having 1 to 4 carbon atom(s) independently, n represents a positive number and $R^1$ and $R^2$ represent the same meanings as those previously described respectively, can be illustrated.

Its molecular weight is 1,000 to 20,000, preferably 1,300 to 5,000 as a weight average molecular weight in terms of polystyrene obtained with the GPC method. If Mw is less than 1,000, it is difficult for a polyorganosilsesquioxane comprising a ladder structure having a partially branched structure to be obtained. On the other hand, if Mw exceeds 20,000, its compatibility when blended or copolymerized with a (meth)acrylic copolymer becomes insufficient whereupon resolution after exposure is deteriorated.

The (co)polymer comprising a (meth)acrylic-based polymer structure having a side chain decomposable with an acid to generate an organic acid group is a (copolymer comprising a (meth)acrylic-based polymer structure having the side chain decomposable with an acid to generate an organic acid group represented by the formula (7):

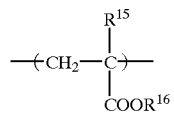

(7)

wherein $R^{15}$ represents a hydrogen atom or a methyl group, and $R^{16}$ represents a group decomposable with an acid, and preferably further comprising the polymer structure represented by the formula (8):

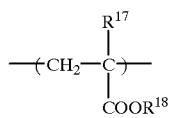

(8)

wherein $R^{17}$ represents a hydrogen or methyl group and $R^{18}$ represents a hydrogen atom or an alkyl group having 1 to 10 carbon atom(s).

As the (meth)acrylic-based monomer for introducing the (meth)acrylic-based polymer structure represented by the formula (7), a compound similar to the (meth)acrylic-based monomer for introducing the (meth)acrylic-based polymer structure of the formula (3) above can be used.

As the (meth)acrylic-based monomer for introducing the (meth)acrylic-based polymer structure represented by the formula (8), a compound similar to a (meth)acrylic-based monomer for introducing the (meth)acrylic-based polymer structure represented by the formula (4) above can be used.

As another polymer structure, a polymer structure represented by a formula (9):

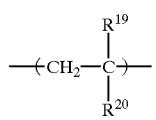

(9)

wherein $R^{19}$ represents a hydrogen atom or a methyl group, and $R^{20}$ represents an organic group such as a hydrocarbon group that may have a substituent, a substituted carbonyl group, a carboxylic acid ester group, carboxylic acid amide group, nitrile group, alkoxy group, a sulfonic acid ester group or the like, or a hydroxyl group, a sulfonic acid group or a halogen atom, may be comprised.

When the formula (9) represents a (meth)acrylic-based polymer structure, as a (meth)acrylic-based monomer for introducing a (meth)acrylic-based polymer structure, a compound similar to the (meth)acrylic-based monomer for introducing the (meth)acrylic-based polymer structure of the formula (5) above can be used; and also, a polymer structure having a polyorganosilsesquioxane structure represented by the formula (10):

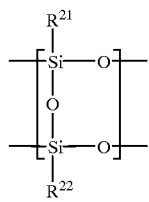

(10)

wherein $R^{21}$ and $R^{23}$ represent the same meanings as $R^1$ and $R^2$ above, and at least one of $R^{21}$ and $R^{22}$ represents a hydrocarbon group having 1 to 10 carbon atom(s) substituted with a (meth)acryloyloxy or vinyl group, may be comprised up to 100 mol %.

As the monomer for introducing the polymer structure represented by the formula (10), polyvinylsilsesquioxane, polymethylvinylsilsesquioxane, poly-γ-methacryloproposysilsesquioxane, polymethyl-γ- methacrylopropoxysilsesquioxane, polyallylsilsesquioxane, polymethylallylsilsesquioxane or the like is illustrated. These can be used individually or in any combination of any two or more thereof.

A (meth)acrylic-based copolymer comprising these polymer structure may any one of a random copolymer, a block copolymer and a random copolymer having a block copolymer partially.

A ratio of the (meth)acrylic-based polymer structure represented by the formula (7) is preferably 10 to 90 mol %, more preferably 30 to 70 mol % against the total copolymer structure (100 mol %). If the ratio is less than 10 mol %, the difference of solubility between before and after exposures in an alkali developer is small so that a sufficient contrast as a resist can not be obtained. While, even if it is more than 90 mol %, further increase of contrast can not be expected by such increase of the ratio thereof.

A ratio of the (meth)acrylic-based polymer structure represented by the formula (8) is preferably 1 to 90 mol % against the total copolymer structure (100 mol %). Particularly, a ratio of the polymer structure in which $R^{17}$ in the formula (8) represents a hydrogen atom is preferably less than 50 mol %, more preferably 5 to 30 mol %. If the ratio of the above-described polymer structure exceeds 50 mol %, an unexposed portion dissolves in an alkali solution so that a desired characteristic as a positive-type resist can not be obtained. A ratio of the polymer structure in which $R^{17}$ in the formula (8) represents an alkyl group is preferably less than 90 mol %, more preferably 10 to 60 mol %. If the ratio is more than 90 mol %, the group decomposable with an acid represented by the formula (7) is less than 10 mol % whereupon a sufficient contrast as a resist can not be obtained.

A ratio of the polymer structure represented by the formula (9) is preferably 0 to 50 mol % against the total polymer structure (100 mol %).

Optionally a vinyl compound which is capable of copolymerizing with the above-described monomer may be copolymerized. As the vinyl compound which is capable of copolymerizing with the above-described monomer, a compound similar to the above-described compound is illustrated.

Polymerization using these polymerizable monomer can be performed in a similar manner to the above-described manner.

A molecular weight of the (meth)acrylic-based (co) polymer obtained by polymerization having a side chain decomposable with an acid is 2,000 to 200,000, preferably 5,000 to 80,000 as weight average molecular weight (Mw) in terms of polystyrene obtained with the GPC method. If Mw is less than 2,000, Tg as a resist resin is low so that a pattern is bent or wound; hence, a desired resolution can not be obtained. While, if Mw exceeds 200,000, not only coatability of the resist is deteriorated but also solubility in an alkali developer after exposure becomes difficult; hence contrast as a resist is reduced.

When the thus obtained (meth)acrylic-based (co)polymer having a side chain group decomposable with an acid to generate an organic acid group is blended with a polyorganosilsesquioxane having the group represented by the formula (1), the blending is performed such that silicon (Si) content in the resist resin is preferably 1 to 30 wt %, more preferably 5 to 15 wt %. If the Si content is less than 1 wt %, oxygen plasma resistance is insufficient whereupon application to a two-layer resist process becomes difficult. While, the Si content exceeds 30 wt %, a ratio of polyorganosilsesquioxane which is soluble in an alkali solution is excessive so that an unexposed portion is likely to be dissolved; as a result, the resolution is deteriorated whereupon it is difficult for a fine pattern to be obtained.

A mixture of polyorganosilsesquioxane having the group represented by the formula (1) and a (meth)acrylic-based (co)polymer having a side chain group decomposable with an acid to generate an organic acid group is preferably used after confirmed that compatibility between the both compounds is favorable.

The compatibility between the both compounds can be judged by a value of transmissibity by means of nephelometry or whether Tg obtained by a DSC (differential scanning calorimeter) is single or double. If the value of the transmissibity by means of nephelometry is less than 80%, or Tg obtained by the DSC is observed as having double peaks corresponding to Tg of each component, then it shows that the compatibility is bad. When the compatibility is bad, the resolution as a resist is deteriorated so that a fine pattern can not be obtained. If the value of transmissibity obtained by nephelometry is more than 80% and Tg obtained by DSC is observed as having single peak, it shows that compatibility is favorable. When the compatibility is favorable, resolution as a resist is favorable so that a fine pattern can be obtained without scum. Measurements of these compatibility are described in detail in the reference (KOUBUNSHI RONBUN-SYU (Japanese Journal of Polymer Science and Technology), vol. 54, 1997, pages 325 to 332, Polymer Alloy and Polymer Blend, Toshio NISHI, Tokyo Kagaku Dojin, 1991).

(VI) Resist Resin Composition

The resist resin composition of the present invention comprises the above-described resist and an acid generator blended therein.

The acid generator is a compound which decomposes to generate an acid by being illuminated by light with a wavelength of 220 nm or less such as a far ultraviolet ray or high energy radiation such as an electron beam, X ray or the like. For example, a triphenylsulfonium salt derivative, an onium salt (for example, a sulfonium salt, an iodonium salt, a phosphonium salt, a diazonium salt, an ammonium salt or the like) or the like described in "Journal of the Organic Chemistry", vol. 43, No. 15, 1978, pages 3055 to 3058 is illustrated. Specifically, the sulfonium compound such as triphenylsulfonium trifluoromethanesulfonate, triphenylsulfonium trifluoromethaneantimonate, triphenylsulfonium benzosulfonate, cyclohexylmethyl(2-oxocyclohexyl) sulfonium trifluoromethanesulfonate, the iodonium compound such as diphenyliodonium trifluoromethanesulfonate or the like, N-hydroxysuccinimide trifluoromethanesulfonate is illustrated but not restrictive to the above. These compounds are used individually or in any combination of any two or more thereof.

A mixing ratio of the above-described acid generator is preferably 0.1 to 20 wt %, more preferably 1 to 5 wt % against the resist resin. If it is less than 0.1 wt %, sensitivity as a chemical amplified type resist is low. On the other hand, if it becomes more than 20 wt %, then transmissibity of a resist composition coating film to light with a wavelength of 220 nm or less is decreased so that a practical problem such as decrease of resolution will occur.

The resist resin composition of the present invention can be used optionally by mixing a conventional resist additive such as a dissolution inhibitor or the like.

As the dissolution inhibitor, for example, a bisphenol A subsutituted OH group with t-BOC, tetrahydrobenzophenone subsutituted with t-BOC or the like can be used. A content of any of these dissolution inhibitors or the like is preferably less than 40 wt %, more preferably 1 to 10 wt %. If it is more than 40 wt %, a low molecular weight component in the resist resin increases whereupon a problem such as decrease of mechanical strength of the resist coating film or the like occurs.

The resist resin composition of the present invention can optionally contain solvent. The solvent to be used here is not limited to any type, as long as each component thereof is dissolved in a sufficient and uniform manner. Moreover, any solvent is applicable as long as the solvent of interest is an organic solvent which allows a coating film to be uniformly formed on a silicon wafer by a spin coating method or the like; hence, any of optional organic solvents which are ordinarily used in the resist resin composition or a mixed solution thereof can be used. As the solvent, for example, methyl alcohol, ethyl alcohol, isopropyl alcohol, n-butyl alcohol, ethylene glycol monomethyl ether, ethylene glycol monoethyl ether, ethylene glycol monoethyl ether acetate (EGA), diethylene glycol monoethyl ether acetate, propylene glycol monoethyl ether, propylene glycol monomethyl ether acetate (PGMEA), methyl 3-methoxypropionate (MMP), ethyl 3-ethoxypropionate (EEP), n-butyl acetate (BA), ethyl lactate (EL) or the like is illustrated but not restrictive to the above. Also, these solvents can be used individually or in any combination of two or more thereof. From the standpoint of safety to a human body, a mixed solvent of propylene glycol monomethyl ether acetate (PGMEA), methyl 3-methoxypropionate (MMP), ethyl 3-ethoxypropionate (EEP) or n-butyl acetate (BA) and ethyl lactate (EL) is preferable.

In the resist resin composition of the present invention., a solid content (total of copolymer-type or mixture-type resist resin, an acid generator and an optionally mixed ordinary resist additive such as a dissolution inhibitor or the like) is 1 to 60 wt %, more preferably 10 to 30 wt %. If the solid content is less than 1 wt %, the film thickness after spin coated becomes too thin; hence, when the resist resin composition is used in two-layer resist process, its protection function as an upper layer Si-based resist film for a lower layer organic resist film is insufficient at the time of oxygen plasma dry development. On the other hand, if the solid content exceeds 60 wt%, the film thickness becomes too thick; hence, an intrinsic merit of two-layer resist process can not be fully exerted to cause a practical problem such as that the aspect ratio comes to be high; a pattern is easy to fall down; depth of focus comes to be shallow; or the like.

An applying method of the resist resin composition of the present invention is not limited to any manner as long as it can coat the silicon wafer uniformly; for example, a method which uses an ordinary device such as spin coating, immersion coating, spray coating, bar coating or the like is applicable; among them, spin coating is favorably applicable.

The thickness of coating film of the resist resin composition of the present invention is not limited to any particular way; but it can be selected as desired within a range of about 10 nm to about 1,000 nm. The thickness can optionally be obtained by a multiple coating operation instead of one-time coating.

The resist resin composition of the present invention comprises not only the above-described basic component such as resin, an acid generator, an additive such as a dissolution inhibitor, and solvent, but also optionally a component such as a surfactant, a dye, a pigment, a stabilizer, a coatability modifier or the like.

(VII) Pattern Forming Method

A method of forming a pattern using the resist resin composition of the present invention can be executed, for example, as follows. Firstly, a solution of the resist resin composition of the present invention is applied on a substrate to be coated by the spin coating operation followed by pre-bake processing. Secondly, the thus applied and prebaked composition is illuminated with light with a wavelength of 220 nm or less, an electron beam or an X ray via photomask for resoluting a predetermined pattern. At this time, in a portion which was illuminated with light with a wavelength of 220 nm or less, an electron beam or X ray, an acid generator is decomposed to generate an acid. By performing a post exposure bake (PEB), a side chain group decomposable with an acid is decomposed with the acid that serves as a catalyst to be soluble in an aqueous alkali solution. By developing with an aqueous alkali solution and rinsing with water, only the portion illuminated with light with a wavelength of 220 nm or less, an electron beam or an X ray is dissolved in the aqueous alkali solution thereby forming a positive-type pattern.

The resist resin composition of the present invention has a polyorganosilsesquioxane structure so that it is excellent in oxygen plasma etching resistance; hence, it is useful for the two-layer resist process.

Namely, an organic high molecular compound layer is formed on the substrate to be coated as a lower layer resist film and then the resist resin composition of the present invention is applied thereon by a spin coating method so that a resist layer has a two-layer structure.

After pre-baked, the upper layer, namely, the resist film of the present invention, is illuminated with light with a wavelength of 220 nm or less, an electron beam or an X ray via photomask for resoluting a predetermined pattern. After PEB, the illuminated resist film is developed with an aqueous alkali solution and thereafter rinsed with water to form a positive-type pattern. Succeedingly, by performing etching with oxygen plasma using the formed pattern as a mask, a lower layer resist film is etched in a selective manner allowing to form the resist pattern of the upper layer onto the lower layer.

As the organic high molecular compound layer as the lower resist film, for example, cyclized rubber-bisazido resin-based resist material, novolak resin-type resist material, polyvinylphenol resin-based resist material, (meth) acrylic resin-based resist material or the like is applicable. After applied on the substrate to be coated, each of these materials is hard baked so that it is prevented from being intermixed with the resist resin composition of the present invention.

BEST MODE FOR CARRYING OUT THE INVENTION

The present invention will now be described in more detail with reference to embodiments: Synthesis Examples, Examples and Comparative Examples, but it should be noted that the present invention is by no means limited thereto.

SYNTHESIS EXAMPLE 1

Synthesis of A-1: Polyorganosilsesquioxane (No Terminal Capping) Having a Side Chain Group Ratio that Methyl to γ-methacryloyloxypropyl is 11 to 1

19 g (0.1 mol) of γ-methacryloyloxypropyltriethoxysilane, 196 g (1.1 mol) of methyltriethoxysilane and 50 g (2.8 mol) of water were put into a 500 ml flask having a thermometer, a stirrer and a reflux condenser. After 0.1 g of 1 mol/l nitric acid was added thereto, the resultant mixture was heated from a room temperature to allow an ethoxy group to be hydrolyzed so as to generate a hydroxyl group. Next, a condensation reaction was performed for two hours keeping a reaction temperature under a total reflux of about 82° C. of azeotropic temperature of ethanol as a byproduct and water. Then, the condensation reaction was continued for one more hour while the azeotropic mixture of ethanol and water was being removed. The resultant reaction solution was cooled down to 35° C., was taken out of a reaction system and kept in a freezer at −20° C.

GPC curb of the thus obtained polyorganosilsesquioxane (solution with a solid content of 50 wt %) showed a single peak and no secondary peak derived from a monomer was noticed. Weight average molecular weight (Mw) was 1,000. By means of NMR analysis, it was confirmed that a mol ratio of a methyl group to a γ-methacryloyloxypropyl group was 11 to 1 based on a mol ratio of starting materials.

SYNTHESIS EXAMPLE 2

Synthesis of A-2: Polyorganosilsesquioxane (Terminal First-stage Capping) Having a Side Chain Group Ratio that Methyl to γ-methacryloyloxypropyl is 11 to 1

19g (0.1 mol) of γ-methacryloyloxypropyltriethoxysilane, 196 g (1.1 mol) of methyltriethoxysilane and 50 g (2.8 mol) of water were put into a 500 ml flask having a thermometer, a stirrer and a reflux condenser. After 0.1 g of 1 mol/l nitric acid was added thereto, the resultant mixture was heated from a room temperature to allow an ethoxy group to be hydrolyzed so as to generate a hydroxyl group. Next, a condensation reaction was performed for two hours keeping a reaction temperature under a total reflux of about 82° C. of azeotropic temperature of ethanol as a byproduct and water. Then, the condensation reaction was continued for more one hour while the azeotropic mixture of ethanol and water was being removed. The mixture was added with 32.5 g (0.2 mol) of hexamethylenedisiloxane and then reacted for two hours at 80° C. to allow terminal hydroxyl and ethoxy groups to be trimethylsilylated. The resultant reaction solution was cooled down to 35° C., was taken out of a reaction system and kept in a cool, dark place.

GPC curb of the thus obtained polyorganosilsesquioxane (solution with a solid content of 50 wt %) showed a single peak and no secondary peak derived from a monomer was noticed. Weight average molecular weight (Mw) was 1,100. By means of NMR analysis, it was confirmed that a mol ratio of a methyl group to a γ-methacryloyloxypropyl group was 11 to 1 based on a mol ratio of starting materials. It was also confirmed from a total number of terminal hydroxyl and ethoxy groups obtained from each peak of $^1$H, $^{13}$C and $^{29}$Si-NMR that an endcapping substituted ratio was 80%.

SYNTHESIS EXAMPLE 3

Synthesis of A-3: Polyorganosilsesquioxane (No Terminal Capping) Having a Side Chain Group Ratio that Methyl to γ-methacryloyloxypropyl is 11 to 1

19 g(0.1 mol) of γ-methacryloyloxypropyltriethoxysilane, 196 g (1.1 mol) of methyltriethoxysilane and 50.0 g (2.8 mol) of water were put into a 500 ml flask having a thermometer, a stirrer and a reflux condenser. After 0.1 g of 1 mol/l nitric acid was added thereto, the resultant mixture was heated from a room temperature to allow an ethoxy group to be hydrolyzed so as to generate a hydroxyl group.

Next, a condensation reaction was performed for six hours keeping a reaction temperature under a total reflux of about 82° C. of azeotropic temperature of ethanol as a byproduct and water. Then, the condensation reaction was continued for three more hours while the azeotropic mixture of ethanol and water was being removed. The resultant reaction solution was cooled down to 35° C., was taken out of a reaction system and kept in a cool, dark place.

GPC curb of the thus obtained polyorganosilsesquioxane (solution with a solid content of 50 wt %) showed a single peak and no secondary peak derived from a monomer was noticed. Weight average molecular weight (Mw) was 10,000. By means of NMR analysis, it was confirmed that a mol ratio of a methyl group to a γ-methacryloyloxypropyl group was 11 to 1 based on a mol ratio of starting materials.

SYNTHESIS EXAMPLE 4

Synthesis of B-1: Acrylic Copolymer (Si Content Being 10 wt %) Having an A-1

6.9g of the A-1 solution (a 50 wt % ethanol solution of polyorganosilsesquioxane (no terminal capping) having a side chain group ratio that methyl to γ-methacryloyloxypropyl is 11 to 1) prepared in Synthesis Example 1, 10.16 g of tert-butyl methacrylate, 1.72 g of methacrylic acid and 93.9 g of propylene glycol monomethyl ether acetate (PGMEA) were first put into a 500 ml round bottom flask having a thermometer, a stirrer and a reflux condenser. Then 2 mol % each of azobisisobutyronitrile as a polymerization initiator and t-butyldodecanethiol as a chain transfer agent against 100 mol % of the monomer was added thereto. The resultant mixture was stirred for one hour under an atmosphere of nitrogen flow, then kept at 80° C. as a reaction temperature for three hours and thereafter at 90° C. for one hour to achieve an addition reaction.

Thereafter, the resultant reaction solution was poured into 1 liter of hexane to repeat reprecipitation twice. The thus sedimented polymeric precipitation was collected by filtration and then solvent was removed therefrom by drying at reduced pressure by means of a rotary evaporator. It was added with PGMEA to prepare a solution with a solid content of 20 wt %.

GPC curb of the thus obtained acrylic copolymer (solution with a solid content of 30 wt %) showed a single peak and no secondary peak derived from a monomer was noticed. Weight average molecular weight (Mw) was 3,500.

SYNTHESIS EXAMPLE 5

Synthesis of B-2: Acrylic Copolymer (Si Content Being 10 wt %) Having an A-2

7.7 g of the A-2 solution (a 50 wt % ethanol solution of polyorganosilsesquioxane (terminal first stage capping) having a side chain group ratio that methyl to γ-methacryloyloxypropyl is 11 to 1) prepared in Synthesis Example 2, 10.16 g of tert-butyl methacrylate, 1.72 g of methacrylic acid and 97.9 g of PGMEA were first put into a 500 ml round bottom flask having a thermometer, a stirrer and a reflux condenser. Then 2 mol % each of azobisisobutyronitrile as a polymerization initiator and t-butyldodecanethiol as a chain transfer agent against 100 mol % of the monomer was added thereto. The resultant mixture was stirred for one hour under an atmosphere of nitrogen flow, then kept at 80° C. as a reaction temperature for three hours and thereafter at 90° C. for one hour to achieve an addition reaction. Thereafter, the resultant reaction solution was poured into 1 liter of hexane to repeat reprecipitation twice. The thus sedimented polymeric precipitation was collected by filtration and then solvent was removed therefrom by drying at reduced pressure by means of a rotary evaporator. It was added with PGMEA to prepare a solution with a solid content of 20 wt %.

GPC curb of the thus obtained acrylic copolymer (solution with a solid content of 30 wt %) showed a single peak and no secondary peak derived from a monomer was noticed. Weight average molecular weight (Mw) was 4,000.

SYNTHESIS EXAMPLE 6

Synthesis of B-3: Acrylic Copolymer (Si Content Being 20 wt %) Having an A-1

13.8 g of the A-1 solution (a 50 wt % ethanol solution of polyorganosilsesquioxane (no terminal capping) having a side chain group ratio that methyl to γ-methacryloyloxypropyl is 11 to 1) prepared in Synthesis Example 1, 8.9 g of tert-butyl methacrylate, 1.72 g of methacrylic acid and 122.1 g of methyl 3-methoxypropionate (MMP) were first put into a 500 ml round bottom flask having a thermometer, a stirrer and a reflux condenser. Then 2 mol % each of azobisisobutyronitrile as a polymerization initiator and t-butyldodecanethiol as a chain transfer agent against 100 mol % of the monomer was added thereto. The resultant mixture was stirred for one hour under an atmosphere of nitrogen flow, then kept at 80° C. as a reaction temperature for three hours and thereafter at 90° C. for one hour to achieve an addition reaction. Thereafter, the resultant reaction solution was poured into 1 liter of hexane to repeat reprecipitation twice. The thus sedimented polymeric precipitation was collected by filtration and then solvent was removed therefrom by drying at reduced pressure by means of a rotary evaporator. It was added with PPM to prepare a solution with a solid content of 20 wt %.

GPC curb of the thus obtained acrylic copolymer (solution with a solid content of 20 wt %) showed a single peak and no secondary peak derived from a monomer was noticed. Weight average molecular weight (Mw) was 3,800.

SYNTHESIS EXAMPLE 7

Synthesis of B-4: Acrylic Copolymer (Si Content Being 10 wt %) Having an A-3

86 g of the A-3 solution (a 50 wt % ethanol solution of polyorganosilsesquioxane (no terminal capping) having a side chain group ratio that methyl to γ-methacryloyloxypropyl is 11 to 1) prepared in Synthesis Example 3, 10.16 g of tert-butyl methacrylate, 1.72 g of methacrylic acid and 244.7 g of PGMEA were first put into a 500 ml round bottom flask having a thermometer, a stirrer and a reflux condenser. Then 2 mol % each of azobisisobutyronitrile as a polymerization initiator and lauryl mercaptan as a chain transfer agent against 100 mol % of the monomer was added thereto. The resultant mixture was stirred for one hour under an atmosphere of nitrogen flow, then kept at 80° C. as a reaction temperature for three hours and thereafter at 90° C. for one hour to achieve an addition reaction. Thereafter, the resultant reaction solution was poured into 1 liter of hexane to repeat reprecipitation twice. The thus sedimented polymeric precipitation was collected by filtration and then solvent was removed therefrom by drying at reduced pressure by means of a rotary evaporator. It was added with PGMEA to prepare a solution with a solid content of 20 wt %.

GPC curb of the thus obtained acrylic copolymer (solution with solid content of 30 wt %) showed a single peak and no secondary peak derived from a monomer was noticed. Weight average molecular weight (Mw) was 15,000.

SYNTHESIS EXAMPLE 8

Synthesis of A-4: Polyorganosilsesquioxane (No Terminal Capping) Having a Side Chain Group Ratio that Methyl to γ-methacryloyloxypropyl is 16 to 1

200.0 g (1.12 mol) of methyltriethoxysilane, 20.4 g (0.07 mol) of γ-methacryloyloxypropyltriethoxysilane, and 50.0 g (2.8 mol) of water were initially put into a 500 ml flask having a thermometer, a stirrer and a reflux condenser. Then 0.2 g of 0.1 mol/l nitric acid was added thereto. The resultant mixture was heated from a room temperature to allow an ethoxy group to be hydrolyzed so as to generate a hydroxyl group. Next, a condensation reaction was performed under a total reflux for four hours keeping a reaction temperature at about 82° C. of azeotropic temperature of ethanol as a byproduct and water. Then, the condensation reaction was continued for three more hours while the azeotropic mixture of ethanol and water was being removed. The resultant reaction solution was cooled down to 35° C., was taken out of a reaction system and kept in a freezer at −20° C.

GPC curb of the thus obtained polyorganosilsesquioxane solution (solid content being 37 wt %) showed a single peak and no secondary peak derived from a monomer was noticed. Weight average molecular weight (Mw) was 1,600 (calculated as polystyrene). By means of $^{13}$C-NMR analysis, it was confirmed that a mol ratio of a methyl group to a γ-methacryloyloxypropyl group was 16 to 1 based on a mol ratio of dosages of starting materials. It was also confirmed by $^{29}$Si-NMR that the thus obtained polyorganosilsesquioxane was a ladder structure having a partially branched structure.

SYNTHESIS EXAMPLE 9

Synthesis of A-5: Polyorganosilsesquioxane (No Terminal Capping) Having a Side Chain Group Ratio that Methyl to Vinyl is 10 to 1

178.3 g (1.0 mol) of methyltriethoxysilane, 19.0 g (0.1 mol) of vinyl triethoxysilane, and 45.5 g (2.5 mol) of water were initially put into a 500 ml flask having a thermometer, a stirrer and a reflux condenser. Then 0.2 g of 0.1 mol/l nitric acid was added thereto. The resultant mixture was heated from a room temperature to allow an ethoxy group to be hydrolyzed to produce a hydroxyl group. Next, a condensation reaction was performed under a total reflux for four hours keeping a reaction temperature at about 82° C. of azeotropic temperature of ethanol as a byproduct and water. Then, the condensation reaction was continued for three more hours while the azeotropic mixture of ethanol and water was being removed. The resultant reaction solution was cooled down to 35° C., was taken out of a reaction system and kept in a freezer at −20° C.

GPC curb of the thus obtained polyorganosilsesquioxane solution (solid content being 37 wt %) showed a single peak and no secondary peak derived-from a monomer was noticed. Weight average molecular weight (Mw) was 1,300 (calculated as polystyrene). By means of $^{13}$C-NMR analysis, it was confirmed that a mol ratio of a methyl group to a vinyl group was 10 to 1 based on a mol ratio of dosages of starting materials. It was also confirmed by $^{29}$Si-NMR that the thus obtained polyorganosilsesquioxane was a ladder structure having a partially branched structure.

SYNTHESIS EXAMPLE 10

Synthesis of A-6: Polyorganosilsesquioxane (No Terminal Capping) Having a Side Chain Group Ratio that Methyl to propyl is 20 to 1

178.3 g (1.0 mol) of methyltriethoxysilane, 7.5 g (0.05 mol) of n-propyltriethoxysilane, and 43.5 g (2.4 mol) of water were initially put into a 500 ml flask having a thermometer, a stirrer and a reflux condenser. After 0.2 g of 0.1 mol/l nitric acid was added thereto, the resultant mixture was heated from a room temperature to allow an ethoxy group to be hydrolyzed to produce a hydroxyl group. Next, a condensation reaction was performed under a total reflux for four hours keeping a reaction temperature at about 82° C. of azeotropic temperature of ethanol as a byproduct and water. Then, the condensation reaction was continued for three more hours while the azeotropic mixture of ethanol and water was being removed. The resultant reaction solution was cooled down to 35° C., was taken out of a reaction system and kept in a freezer at −20° C.

GPC curb of the thus obtained polyorganosilsesquioxane solution (solid content being 37 wt %) showed a single peak and no secondary peak derived from a monomer was noticed. Weight average molecular weight (Mw) was 1,500 (calculated as polystyrene). By means of $^{13}$C-NMR analysis, it was confirmed that a mol ratio of a methyl group to a propyl group was 20 to 1 based on a mol ratio of dosages of starting materials. It was also confirmed by $^{29}$Si-NMR that the thus obtained polyorganosilsesquioxane was a ladder structure having a partially branched structure.

SYNTHESIS EXAMPLE 11

Synthesis of A-7: Polyorganosilsesquioxane (No Terminal Capping) Having a Side Chain Group Ratio that Methyl to γ-methacryloyloxypropyl is 16 to 1

200.0 g (1.12 mol) of methyltriethoxysilane, 20.4 g (0.07 mol) of γ-methacryloyloxypropyltriethoxysilane, and 50.0 g (2.8 mol) of water were initially put into a 500 ml flask having a thermometer, a stirrer and a reflux condenser. After 2.0 g of 0.1 mol/l nitric acid was added thereto, the resultant mixture was heated from a room temperature to allow an ethoxy group to be hydrolyzed so as to generate a hydroxyl group. Next, a condensation reaction was performed under a total reflux for four hours keeping a reaction temperature at about 82° C. of azeotropic temperature of ethanol as a byproduct and water. Then, the condensation reaction was continued for eight more hours while the azeotropic mixture of ethanol and water was being removed. The resultant reaction solution was cooled down to 35° C., was taken out of a reaction system and kept in a freezer at −20° C.

GPC curb of the thus obtained polyorganosilsesquioxane solution (solid content being 37 wt %) showed a single peak and no secondary peak derived from a monomer was noticed. Weight average molecular weight (Mw) was 15,000 (calculated as polystyrene). By means of $^{13}$C-NMR analysis, it was confirmed that a mol ratio of a methyl group to a γ-methacryloyloxypropyl group was 16 to 1 based on a mol ratio of dosages of starting materials. It was also confirmed by $^{29}$Si-NMR that the thus obtained polyorganosilsesquioxane was a ladder structure having a partially branched structure.

SYNTHESIS EXAMPLE 12

Synthesis of B-5: Acrylic Copolymer 10 g (0.1 mol) of methyl methacrylate, 14.2 g (0.1 mol) of tert-butyl methacrylate, 1.9 g (0.023 mol) of methacrylic acid and 105.3 g of PGMEA were first put into a 500 ml flask having a thermometer, a stirrer and a reflux condenser. Then 2 mol % each of azobisisobutyronitrile as a polymerization initiator and lauryl mercaptan as a chain transfer agent against 100 mol % of the monomer was added thereto. The resultant mixture was stirred for one hour under a nitrogen atmosphere, heated from a room temperature to 80° C., then kept thereat as a reaction temperature for five hours, further heated to 90° C. and thereafter kept thereat for one hour to achieve a radical polymerization reaction. Thereafter, the resultant reaction solution was poured into 1 liter of hexane to repeat reprecipitation twice for purification. The thus sedimented polymeric precipitation was collected by filtration and then solvent was removed therefrom by drying at reduced pressure by means of a rotary evaporator. It was added with PGMEA to prepare a solution with a solid content of 20 wt %.

GPC curb of the thus obtained acrylic copolymer showed a single peak and no secondary peak derived from a monomer was noticed. Weight average molecular weight (Mw) was 40,000 (calculated as polystyrene). By means of $^{13}$C-NMR analysis, it was confirmed that mole ratio of copolymer composition (components) is based on dosages of starting materials and that methyl methacrylate:tert-butyl methacrylate:methacrylic acid was 45:45:10.

SYNTHESIS EXAMPLE 13

Synthesis of B-6: Acrylic Copolymer 7.8 g (0.055 mol) of n-butyl methacrylate, 20.6 g (0.145 mol) of tert-butyl methacrylate, 1.9 g (0.023 mol) of methacrylic acid and 105.3 g of PGMEA were first put into a 500 ml flask having a thermometer, a stirrer and a reflux condenser. Then 2 mol % each of azobisisobutyronitrile as a polymerization initiator and lauryl mercaptan as a chain transfer agent against 100 mol % of the monomer was added thereto. The resultant mixture was stirred for one hour under a nitrogen atmosphere, heated from a room temperature to 80° C., then kept thereat as a reaction temperature for five hours, further heated to 90° C. and thereafter kept thereat for one hour to achieve a radical polymerization reaction. Thereafter, the resultant reaction solution was poured into 1 liter of hexane to repeat reprecipitation twice for purification. The thus sedimented polymeric precipitation was collected by filtration and then solvent was removed therefrom by drying at reduced pressure by means of a rotary evaporator. It was added with PGMEA to prepare a solution with a solid content of 20 wt %.

GPC curb of the thus obtained acrylic copolymer showed a single peak and no secondary peak derived from a monomer was noticed. Weight average molecular weight (Mw) was 35,000 (calculated as polystyrene). It was confirmed by means of $^{13}$C-NMR analysis that mole ratio of copolymer composition (components) is based on dosages of starting materials and that n-butyl methacrylate:tert-butyl methacrylate:methacrylic acid was 25:65:10.

SYNTHESIS EXAMPLE 14

Synthesis of B-7: Acrylic Copolymer 10 g (0.1 mol) of metyl methacrylate, 16.9 g (0.1 mol) of tetrahydropyranyl methacrylate, 1.9 g (0.023 mol) of methacrylic acid and 105.3 g of PGMEA were first put into a 500 ml flask having a thermometer, a stirrer and a reflux condenser. Then 2 mol % each of azobisisobutyronitrile as a polymerization initiator and lauryl mercaptan as a chain transfer agent against 100 mol % of the monomer was added thereto. The resultant mixture was stirred for one hour under a nitrogen atmosphere, heated from a room temperature to 80° C., then kept thereat as a reaction temperature for five hours, further heated to 90° C. and thereafter kept thereat for one hour to achieve a radical polymerization reaction. Thereafter, the resultant reaction solution was poured into 1 liter of hexane to repeat reprecipitation twice for purification. The thus sedimented polymeric precipitation was collected by filtration and then solvent was removed therefrom by drying at reduced pressure by means of a rotary evaporator. It was added with PGMEA to prepare a solution with a solid content of 20 wt %.

GPC curb of the thus obtained acrylic copolymer showed a single peak and no secondary peak derived from a monomer was noticed. Weight average molecular weight (Mw) was 25,000 (calculated as polystyrene). It was confirmed by $^{13}$C-NMR analysis that mole ratio of copolymer composition (components) is based on dosages of starting materials and that methyl methacrylate:tetrahydropyranyl methacrylate: methacrylic acid was 45:45:10.

SYNTHESIS EXAMPLE 15

Synthesis of A-8: Polyorganosilsesquioxane (No Terminal Capping) Having a Side Chain Group Ratio that Methyl to propyl is 16 to 1

200.0 g (1.12 mol) of methyltriethoxysilane, 213.3 g (0.07 mol) of propyltriethoxysilane, and 50.0 g (2.8 mol) of water were initially put into a 500 ml flask having a thermometer, a stirrer and a reflux condenser. After 0.2 g of 0.1 mol/l nitric acid was added thereto, the resultant mixture was heated from a room temperature to allow an ethoxy group to be hydrolyzed to produce a hydroxyl group. Next, a condensation reaction was performed under a total reflux for four hours keeping a reaction temperature at about 82° C. of azeotropic temperature of ethanol as a byproduct and water. Then, the condensation reaction was continued for three more hours while the azeotropic mixture of ethanol and water was being removed. The resultant reaction solution was cooled down to 35° C., was taken out of a reaction system and kept in a freezer at −20° C.

GPC curb of the thus obtained polyorganosilsesquioxane solution (solid content being 37 wt %) showed a single peak and no secondary peak derived from a monomer was noticed. Weight average molecular weight (Mw) was 1,600 (calculated as polystyrene). It was confirmed by $^{13}$C-NMR analysis that a mol ratio of a side chain methyl group to a propyl group was 16 to 1 based on a mol ratio of dosages of starting materials. It was also confirmed by $^{29}$Si-NMR that the thus obtained polyorganosilsesquioxane was a ladder structure having a partially branched structure.

SYNTHESIS EXAMPLE 16

Synthesis of A-9: Polyorganosilsesquioxane (Terminal First Stage Capping) Having a Side Chain Group Ratio that Methyl to Propyl is 16 to 1

200.0 g (1.12 mol) of methyltriethoxysilane, 13.3 g (0.07 mol) of propyltriethoxysilane, and 50.0 g (2.8 mol) of water were initially put into a 500 ml flask having a thermometer, a stirrer and a reflux condenser. After 0.2 g of 0.1 mol/l nitric acid was added thereto, the resultant mixture was heated from a room temperature to allow an ethoxy group to be hydrolyzed to produce a hydroxyl group. Next, a condensation reaction was performed under a total reflux for five hours keeping a reaction temperature at about 82° C. of azeotropic temperature of ethanol as a byproduct and water. Then, 63.0 g of 1,3-bis(hydroxypropyl) tetramethyldisiloxane is added to perform an endcapping reaction for three hours. Thereafter, the azeotropic mixture of ethanol and water was removed under a total reflux for two hours. The resultant reaction solution was cooled down to 35° C., was taken out of a reaction system and kept in a freezer at −20° C. GPC curb of the thus obtained polyorganosilsesquioxane solution (solid content being 37 wt %) showed a single peak and no secondary peak derived from a monomer was noticed. Weight average molecular weight (Mw) was 1,300 (calculated as polystyrene). It was confirmed by $^{13}$C-NMR analysis that a mol ratio of a side chain methyl group to a propyl group was 16 to 1 based on a mol ratio of dosages of starting materials. It was also confirmed by $^{29}$Si-NMR that the thus obtained polyorganosilsesquioxane was a ladder structure having a partially branched structure, as well as a ratio of endcapping was 80%.

SYNTHESIS EXAMPLE 17

Synthesis of A-10: Polyorganosilsesquioxane (Terminal Second Stage Capping) Having a Side Chain Group Ratio that Methyl to Propyl is 16 to 1

200.0 g (1.12 mol) of methyltriethoxysilane, 13.3 g (0.07 mol) of propyltriethoxysilane, and 50.0 g (2.8 mol) of water were initially put into a 500 ml flask having a thermometer, a stirrer and a reflux condenser. After 0.2 g of 0.1 mol/l nitric acid was added thereto, the resultant mixture was heated from a room temperature to allow an ethoxy group to be hydrolyzed to produce a hydroxyl group. Next, a condensation reaction was performed under a total reflux for five hours keeping a reaction temperature at about 82° C. of azeotropic temperature of ethanol as a byproduct and water. Then, 63.0 g of 1,3-bis(hydroxypropyl) tetramethyldisiloxane is added to perform an endcapping reaction for three hours. Succeedingly, 36.3 g of hexamethyldisilazane is added to perform a second stage endcapping reaction for three hours. Thereafter, the azeotropic mixture of ethanol and water was removed under a total reflux for two hours. Further, the condensation reaction was performed for three hours while the azeotropic mixture of ethanol and water was being removed. The resultant reaction solution was cooled down to 35° C., was taken out of a reaction system and kept in a freezer at −20° C. GPC curb of the thus obtained polyorganosilsesquioxane solution (solid content being 37 wt %) showed a single peak and no secondary peak derived from a monomer was noticed. Weight average molecular weight (Mw) was 1,500 (calculated as polystyrene). It was confirmed by $^{13}$C-NMR analysis that a mol ratio of a side chain methyl group to a propyl group was 16 to 1 based on a mol ratio of dosages of starting materials. It was also confirmed by $^{29}$Si-NMR that the thus obtained polyorganosilsesquioxane was a ladder structure having a partially branched structure, as well as a ratio of endcapping was 95%.

SYNTHESIS EXAMPLE 18

Synthesis of A-11: Polyorganosilsesquioxane (Terminal Second Stage Capping) Having a Side Chain Group Ratio that Methyl to γ-methacryloyloxypropyl is 16 to 1

200.0 g (1.12 mol) of methyltriethoxysilane, 20.4 g (0.07 mol) of γ-methacryloylpropyltriethoxysilane, and 50.0 g (2.8 mol) of water were initially put into a 500 ml flask having a thermometer, a stirrer and a reflux condenser. After 2.0 g of 0.1 mol/l nitric acid was added thereto, the resultant mixture was heated from a room temperature to allow an ethoxy group to be hydrolyzed to produce a hydroxyl group. Next, a condensation reaction was performed under a total reflux for five hours keeping a reaction temperature at about 82° C. of azeotropic temperature of ethanol as a byproduct and water. Then, 63.0 g of 1,3-bis(hydroxypropyl) tetramethyldisiloxane is added to perform an endcapping reaction for three hours. Succeedingly, 36.3 g of hexamethyldisilazane is added to perform a second stage endcapping reaction for three hours. Thereafter, the condensation reaction was performed for eight hours while the azeotropic mixture of ethanol and water was being removed. The resultant reaction solution was cooled down to 35° C., was taken out of a reaction system and kept in a freezer at −20° C. GPC curb of the thus obtained polyorganosilsesquioxane solution (solid content being 37 wt %) showed a single peak and no secondary peak derived from a monomer was noticed. Weight average molecular weight (Mw) was 1,500 (calculated as polystyrene). It was confirmed by $^{13}$C-NMR analysis that a mol ratio of a side chain methyl group to a r-methacryloyloxypropyl group was 16 to 1 based on a mol ratio of dosages of starting materials. It was also confirmed by $^{29}$Si-NMR that the thus obtained polyorganosilsesquioxane was a ladder structure having a partially branched structure, as well as a ratio of endcapping was 90 %.

SYNTHESIS EXAMPLE 19

Synthesis of B-8: Acrylic Copolymer Having A-11

14.2 g (0.10 mol) of n-butyl methacrylate, 14.2 g (0.10 mol) of tert-butyl methacrylate, 0.9 g (0.011 mol) of methacrylic acid, 3.5 g of a 37 wt % solution of A-11 prepared in Synthesis Example 18 and 105.3 g of PGMEA were first put into a 500 ml flask having a thermometer, a stirrer and a reflux condenser. Then 2 mol % each of azobisisobutyronitrile as a polymerization initiator and lauryl mercaptan as a chain transfer agent against 100 mol % of the monomer was added thereto. The resultant mixture was stirred for one hour under a nitrogen atmosphere, heated from a room temperature to 80° C., then kept thereat as a reaction temperature for five hours, further heated to 90° C. and thereafter kept thereat for one hour to achieve a radical polymerization reaction. Thereafter, the resultant reaction solution was poured into 1 liter of hexane to repeat reprecipitation twice for purification. The thus sedimented polymeric precipitation was collected by filtration and then solvent was removed therefrom by drying at reduced pressure by means of a rotary evaporator. It was added with PGMEA to prepare a solution with a solid content of 20 wt %.

GPC curb of the thus obtained acrylic copolymer showed a single peak and no secondary peak derived from a monomer was noticed. Weight average molecular weight (Mw) was 35,000 (calculated as polystyrene). It was confirmed by $^{13}$C-NMR analysis that mole ratio of copolymer composition (components) was 40:40:10:10 being based on dosages of starting materials.

SYNTHESIS EXAMPLE 20

Synthesis of B-9: Acrylic Copolymer Having Alicyclic Group 15.0 g of tricyclodecanyl methacrylate, 9.7 g of tert-butyl methacrylate, 1.72 g of methacrylic acid and 132 g of PGMEA were first put into a 500 ml round bottom flask having a thermometer, a stirrer and a reflux condenser. Then 2 mol % each of azobisisobutyronitrile as a polymerization initiator and lauryl mercaptan as a chain transfer agent against 100 mol % of the monomer was added thereto. The resultant mixture was stirred for one hour under an atmosphere of nitrogen flow, then kept at 80° C. as a reaction temperature for three hours and thereafter at 90° C. for one hour to achieve an addition reaction. Thereafter, the resultant reaction solution was poured into 1 liter of hexane to repeat reprecipitation twice. The thus sedimented polymeric precipitation was collected by filtration and then solvent was removed therefrom by drying at reduced pressure by means of a rotary evaporator. It was added with PGMEA to prepare a solution with a solid content of 20 wt %.

GPC curb of the thus obtained acrylic copolymer showed a single peak and no secondary peak derived from a monomer was noticed. Weight average molecular weight (Mw) was 49,000.

SYNTHESIS EXAMPLE 21

Synthesis of A-12: Tert-butylated Polyhydroxycarbonylethylsilsesquioxane 18.9 g of cyanoethyltrichlorosilane dissolved in 20 g of toluene solution was dropped into 50.0 g of water in a 500 ml flask having a thermometer, a stirrer and a reflux condenser while stirring at room temperature. The mixture was heated from room temperature and was subjected to a condensation reaction for five hours while being kept at a reaction temperature under a total reflux condition. The thus obtained reaction solution was cooled down to 35° C. After an acidic liquid layer thereof was separated from the reaction mixture obtained, an organic layer was rinsed with 100 ml of water twice. The thus rinsed organic layer was separated, filtered and then toluene was removed therefrom by drying at reduced pressure by means of a rotary evaporator.

GPC curb of the thus obtained polyhydroxycarbonylethylsilsesquioxane solution (solid content being 50 wt %) showed a single peak and no secondary peak derived from a monomer was noticed. Weight average molecular weight (Mw) was 6,300 (calculated as styrene). From the result that no 2200 cm$^{-1}$ absorption peak characteristic to a cyano group but a 1650 cm$^{-1}$ absorption peak characteristic to carboxylic acid was noticed in FT-IR, it was confirmed that the cyano group was converted to carboxylic acid.

6.3 g of this polymer and 12.5 g of trifluoroacetic acid anhydride were dissolved in 25 ml of acetone to prepare a solution which, then, was added with 6.1 g of tert-butyl alcohol while being stirred and thereafter matured for five hours. Next, unreacted tert-butyl alcohol and acetone were removed from the reaction solution by drying at reduced pressure by means of a rotary evaporator. PGMEA was added to the residue to prepare a solution with a solid content of 20 wt %. Weight average molecular weight (Mw) of the thus obtained tert-butylated polyhydroxycarbonylethylsilsesquioxane was 10,000 (calculated as styrene). It was confirmed by an FT-IR analysis that a tert-butylated ratio of side chain carboxylic acid was 20 wt %.

EXAMPLE 1

Resist Resin Comprising B-1 (Si Content Being 10%)

Triphenylsulfonium hexafluoroantimonate was added as an acid generator to the resin solution B-1 (a solution with a solid content of 20 wt %) prepared in Synthesis Example 4 by 1 wt % against 100 wt % of a resin polymer and then filtered with a 0.2 μm filter to prepare a resist solution. A silicon wafer was spin-coated with this solution thereon at 3000 rpm. The spin-coated silicon wafer was subjected to prebake on a hotplate at 100° C. for 90 seconds. The film obtained had thickness of 500 nm.

After thus obtained resist film on the wafer was exposed by an ArF excimer stepper (aperture NA=0.55), it was subjected to post exposure bake (PEB) at 110 °C. for 90 seconds. Succeedingly, it was developed by a 2.38% tetramethylammonium hydroxide (TMAH) solution for 60 seconds and then rinsed with water for 30 seconds. As a result, the present resist material showed a positive-type characteristic and attained a resolution of 0.14 μm wide of line & space (L&S) by 5 mJ/cm$^2$ of exposure (sensitivity). When Ar plasma etching resistance of this time was compared with a conventional novolak-type resist (Microprosite 1350, produced by Shipley), a relative etching rate (conventional novolak-type resist etching rate/present invention resist etching rate) was 1.1.

EXAMPLE 2

Resist Resin Comprising B-2 (Si Content Being 10%)

Triphenylsulfonium trifluorate was added as an acid generator to the resin solution B-2 (a solution with a solid content of 20 wt %) prepared in Synthesis Example 5 by 1.5 wt % against 100 wt % of resin polymer and then filtered with a 0.2 μm filter to prepare a resist solution. A silicon wafer was spin-coated with this solution thereon at 3000 rpm. The spin-coated silicon wafer was subjected to prebake on a hotplate at 110° C. for 90 seconds. The film obtained had thickness of 450 nm.

After thus obtained resist film on the wafer was exposed by an ArF excimer stepper (NA=0.55), it was subjected to PEB at 120° C. for 90 seconds. Succeedingly, it was developed by a 2.38% TMAH solution for 60 seconds and then rinsed with water for 30 seconds. As a result, the present resist material showed a positive-type characteristic and attained a resolution of 0.13 μm wide of line & space (L&S) by 6 mJ/cm$^2$ of exposure (sensitivity). When Ar plasma etching resistance of this time was compared with a conventional novolak-type resist (Microprosite 1350, produced by Shipley), a relative etching rate was 1.2.

EXAMPLE 3

Resist Resin Comprising B-3 (Si Content Being 20%)

Dioxocyclohexyl 2-norbornylsulfonium triflate was added as an acid generator to the resin solution B-3 (a solution with a solid content of 20 wt %) prepared in Synthesis Example 6 by 1 wt % against 100 wt % of resin polymer and then filtered with a 0.2 μm filter to prepare a resist solution.

A silicon wafer was spin-coated with this solution thereon at 3000 rpm. The spin-coated silicon wafer was subjected to prebake on a hotplate at 110° C. for 90 seconds. The film obtained had thickness of 480 nm.

After thus obtained resist film on the wafer was exposed by an ArF excimer stepper (NA=0.55), it was subjected to PEB at 120° C. for 90 seconds. Succeedingly, it was developed by a 2.38% TMAH solution for 60 seconds and then rinsed with water for 30 seconds. As a result, the present resist material showed a positive-type characteristic and attained a resolution of 0.14 μm wide of line & space (L&S) by 6 mJ/cm$^2$ of exposure (sensitivity). When Ar plasma etching resistance of this time was compared with a conventional novolak-type resist (Microprosite 1350, produced by Shipley), a relative etching rate was 1.0.

EXAMPLE 4

Resist Resin Comprising B-4 (Si Content Being 10%)

Triphenylsulfonium triflate was added as an acid generator to the resin solution B-4 (a solution with a solid content of 20 wt %) prepared in Synthesis Example 7 by 1.5 wt % against 100 wt % of resin polymer and then filtered with a 0.2 μm filter to prepare a resist solution.

A silicon wafer was spin-coated with this solution thereon at 3000 rpm. The spin-coated silicon wafer was subjected to prebake on a hotplate at 110° C. for 90 seconds. The film obtained had thickness of 450 nm.

After thus obtained resist film on the wafer was exposed by an ArF excimer stepper (NA=0.55), it was subjected to PEB at 120° C. for 90 seconds. Succeedingly, it was developed by a 2.38% TMAH solution for 60 seconds and then rinsed with water for 30 seconds. As a result, the present resist material showed a positive-type characteristic and attained a resolution of 0.15 μm wide of line & space (L&S) by 9 mJ/cm$^2$ of exposure (sensitivity). When Ar plasma etching resistance of this time was compared with a conventional novolak-type resist (Microprosite 1350, produced by Shipley), a relative etching rate was 1.2.

EXAMPLE 5

Resist Resin Comprising Mixture of A-4 and B-5 (Si Content Being 10%)

127.4 g of PGMEA was added to 14.8 g of the polyorganosilsesquioxane solution A-4 (solid content being 37%) prepared in Synthesis Example 8 and 57.8 g of the acrylic copolymer resin B-5 (solid content being 20%) prepared in Synthesis Example 8 and then triphenylsulfonium hexafluoroantimonate was added as an acid generator thereto by 2 wt % against 100 wt % of resin polymer. The resultant solution was filtered with a 0.2 μm filter to prepare an Si-based resist solution having a solid content of 10 wt %.

An 8 inch silicon wafer which had already been coated with a novolak resist (Microprosite 1350, produced by Shipley) layer of 670 nm thick was spin-coated with the above-prepared resist solution at 3000 rpm. The spin-coated silicon wafer was subjected to prebake (PB) on a hotplate at 100° C. for 60 seconds to obtain a film of 100 nm thick. The thus obtained Si-based resist film was exposed by an ArF excimer stepper (NA=0.55, produced by Nikon), subjected to PEB at 90° C. for 60 seconds, developed by a 2.38% TMAH solution for 60 seconds and then rinsed with water. As a result, the Si-based resist material showed a positive-type characteristic and attained a resolution of 0.13 μm wide of line and space by 5 mJ/cm$^2$ of exposure (sensitivity). Thereafter, oxygen plasma processing was performed using this pattern as a mask to allow the pattern to be transferred to a lower layer novolak resin. As a result, a resolution of 0.13 μm wide of line and space having an aspect ratio of 5.1 was able to be obtained without scum.

EXAMPLE 6

Resist Resin Comprising Mixture of A-5 and B-6 (Si Content Being 10%)

127.4 g of PGMEA was added to 14.8 g of the polyorganosilsesquioxane resin solution A-5 (solid content being 37%) prepared in Synthesis Example 9 and 57.8 g of the acrylic copolymer resin B-6 (solid content being 20%) prepared in Synthesis Example 13 and then triphenylsulfonium hexafluoro-antimonate was added as an acid generator thereto by 2 wt % against 100 wt % of resin polymer. The resultant solution was filtered with a 0.2 μm filter to prepare an Si-based resist solution having a solid content of 10 wt %.

An 8 inch silicon wafer which had already been coated with a novolak resist (Microprosite 1350, produced by Shipley) layer of 670 nm thick was spin-coated with the above-prepared resist solution at 3000 rpm. The spin-coated silicon wafer was subjected to prebake on a hotplate at 100° C. for 60 seconds to obtain a film of 100 nm thick. The thus obtained Si-based resist film was exposed by an ArF excimer stepper (NA=0.55, produced by Nikon), subjected to PEB at 90° C. for 60 seconds, developed by a 2.38% TMAH solution for 60 seconds and then rinsed with water. As a result, the Si-based resist material showed a positive-type characteristic and attained a resolution of 0.14 μm wide of line and space by 10 mJ/cm$^2$ of exposure (sensitivity). Thereafter, oxygen plasma processing was performed using this pattern as a mask to allow the pattern to be transferred to a lower layer novolak resin. As a result, a resolution of 0.14 μm wide of line and space having an aspect ratio of 4.7 was able to be obtained without scum.

EXAMPLE 7

Resist Resin Comprising Mixture of A-6 and B-7
(Si Content Being 10%)

127.4 g of PGMEA was added to 14.8 g of the polyorganosilsesquioxane resin solution A-6 (solid content being 37%) prepared in Synthesis Example 10 and 57.8 g of the acrylic copolymer resin B-7 (solid content being 20%) prepared in Synthesis Example 14 and then triphenylsulfonium hexafluoroantimonate was added as an acid generator thereto by 2 wt % against 100 wt % of resin polymer. The resultant solution was filtered with a 0.2 m filter to prepare an Si-based resist solution having a solid content of 10 wt %.

An 8 inch silicon wafer which had already been coated with a novolak resist (Microprosite 1350, produced by Shipley) layer of 670 nm thick was spin-coated with the above-prepared resist solution at 3000 rpm. The spin-coated silicon wafer was subjected to prebake on a hotplate at 100° C. for 60 seconds to obtain a film of 100 nm thick. The thus obtained Si-based resist film was exposed by an ArF excimer stepper (NA=0.55, produced by Nikon), subjected to PEB at 90° C. for 60 seconds, developed by a 2.38% TMAH solution for 60 seconds and then rinsed with water. As a result, the Si-based resist material showed a positive-type characteristic and attained a resolution of 0.14 μm wide of line and space by 7 mJ/cm$^2$ of exposure (sensitivity). Thereafter, oxygen plasma processing was performed using this pattern as a mask to allow the pattern to be transferred to a lower layer novolak resin. As a result, a resolution of 0.14 μm wide of line and space having an aspect ratio of 4.7 was able to be obtained without scum.

EXAMPLE 8

Resist Resin Comprising Mixture of A-4 and B-5
(Si Content Being 5%)

127.4 g of PGMEA was added to 7.4 g of the polyorganosilsesquioxane resin solution A-4 (solid content being 37%) prepared in Synthesis Example 8 and 57.8 g of the acrylic copolymer resin B-5 (solid content being 20%) prepared in Synthesis Example 12 and then triphenylsulfonium hexafluoroantimonate was added as an acid generator thereto by 2 wt % against 100 wt % of resin polymer. The resultant solution was filtered with a 0.2 μm filter to prepare an Si-based resist solution having a solid content of 10 wt %.

An 8 inch silicon wafer which had already been coated with a novolak resist (Microprosite 1350, produced by Shipley) layer of 670 nm thick was spin-coated with the above-prepared resist solution at 3000 rpm. The spin-coated silicon wafer was subjected to prebake on a hotplate at 100° C. for 60 seconds to obtain a film of 100 nm thick. The thus obtained Si-based resist film was exposed by an ArF excimer stepper (NA=0.55, produced by Nikon), subjected to PEB at 90° C. for 60 seconds, developed by a 2.38% TMAH solution for 60 seconds and then rinsed with water. As a result, the Si-based resist material showed a positive-type characteristic and attained a resolution of 0.12 μm wide of line and space by 5 mJ/cm$^2$ of exposure (sensitivity). Thereafter, oxygen plasma processing was performed using this pattern as a mask to allow the pattern to be transferred to a lower layer novolak resin. As a result, a resolution of 0.12 μm wide of line and space having an aspect ratio of 5.5 was able to be obtained without scum.

EXAMPLE 9

Resist Resin Comprising Mixture of A-7 and B-5
(Si Content Being 10%)

127.4 g of PGMEA was added to 14.8 g of the polyorganosilsesquioxane resin solution A-7 (solid content being 37%) prepared in Synthesis Example 11 and 57.8 g of the acrylic copolymer resin B-5 (solid content being 20%) prepared in Synthesis Example 12 and then triphenylsulfonium hexafluoroantimonate was added as an acid generator thereto by 2 wt % against 100 wt % of resin polymer. The resultant solution was filtered with a 0.2 μm filter to prepare an Si-based resist solution having a solid content of 10 wt %.

An 8 inch silicon wafer which had already been coated with a novolak resist (Microprosite 1350, produced by Shipley) layer of 670 nm thick was spin-coated with the above-prepared resist solution at 3000 rpm. The spin-coated silicon wafer was subjected to prebake on a hotplate at 100° C. for 60 seconds to obtain a film of 100 nm thick. The thus obtained Si-based resist film was exposed by an ArF excimer stepper (NA=0.55, produced by Nikon), subjected to PEB at 90° C. for 60 seconds, developed by a 2.38% TMAH solution for 60 seconds and then rinsed with water. As a result, the Si-based resist material showed a positive-type characteristic and attained a resolution of 0.15 μm wide of line and space by 10 mJ/cm$^2$ of exposure (sensitivity). Thereafter, oxygen plasma processing was performed using this pattern as a mask to allow the pattern to be transferred to a lower layer novolak resin. As a result, a resolution of 0.15 μm wide of line and space having an aspect ratio of 4.4 was able to be obtained without scum.

EXAMPLE 10

Resist Resin Comprising Mixture of A-8 and B-5
(Si Content Being 10%)

127.4 g of PGMEA was added to 14.8 g of the polyorganosilsesquioxane resin solution A-8 (solid content being 37%) prepared in Synthesis Example 15 and 57.8 g of the acrylic copolymer resin B-5 (solid content being 20%) prepared in Synthesis Example 12 and then triphenylsulfonium hexafluoroantimonate was added as an acid generator thereto by 2 wt % against 100 wt % of resin polymer. The resultant solution was filtered with a 0.2 μm filter to prepare an Si-based resist solution having a solid content of 10 wt %.

An 8 inch silicon wafer which had already been coated with a novolak resist (Microprosite 1350, produced by Shipley) layer of 670 nm thick was spin-coated with the above-prepared resist solution at 3000 rpm. The spin-coated silicon wafer was subjected to prebake on a hotplate at 100° C. for 60 seconds to obtain a film of 100 nm thick. The thus obtained Si-based resist film was exposed by an ArF excimer stepper (NA=0.55, produced by Nikon), subjected to PEB at 90° C. for 60 seconds, developed by a 2.38% TMAH solution for 60 seconds and then rinsed with water. As a result, the Si-based resist material showed a positive-type characteristic and attained a resolution of 0.15 μm wide of line and space by 5 mJ/cm$^2$ of exposure (sensitivity). Thereafter, oxygen plasma processing was performed using this pattern as a mask to allow the pattern to be transferred to a lower layer novolak resin. As a result, a resolution of 0.15 μm wide of line and space having an aspect ratio of 5.1 was able to be obtained without scum.

EXAMPLE 11

Resist Resin Comprising Mixture of A-9 and B-5 (Si Content Being 10%)

127.4 g of PGMEA was added to 14.8 g of the polyorganosilsesquioxane resin solution A-9 (solid content being 37%) prepared in Synthesis Example 16 and 57.8 g of the acrylic copolymer resin B-5 (solid content being 20%) prepared in Synthesis Example 12 and then triphenylsulfonium hexafluoroantimonate was added as an acid generator thereto by 2 wt % against 100 wt % of resin polymer. The resultant solution was filtered with a 0.2 μm filter to prepare an Si-based resist solution having a solid content of 10 wt %.

An 8 inch silicon wafer which had already been coated with a novolak resist (Microprosite 1350, produced by Shipley) layer of 670 nm thick was spin-coated with the above-prepared resist solution at 3000 rpm. The spin-coated silicon wafer was subjected to prebake on a hotplate at 100° C. for 60 seconds to obtain a film of 100 nm thick. The thus obtained Si-based resist film was exposed by an ArF excimer stepper (NA=0.55, produced by Nikon), subjected to PEB at 90° C. for 60 seconds, developed by a 2.38% TMAH solution for 60 seconds and then rinsed with water. As a result, the Si-based resist material showed a positive-type characteristic and attained a resolution of 0.14 μm wide of line and space by 10 mJ/cm$^2$ of exposure (sensitivity). Thereafter, oxygen plasma processing was performed using this pattern as a mask to allow the pattern to be transferred to a lower layer novolak resin. As a result, a resolution of 0.14 μm wide of line and space having an aspect ratio of 4.7 was able to be obtained without scum.

EXAMPLE 12

Resist Resin Comprising Mixture of A-10 and B-5 (Si Content Being 10%)

127.4 g of PGMEA was added to 14.8 g of the polyorganosilsesquioxane resin solution A-10 (solid content being 37%) prepared in Synthesis Example 17 and 57.8 g of the acrylic copolymer resin B-5 (solid content being 20%) prepared in Synthesis Example 12 and then triphenylsulfonium hexafluoroantimonate was added as an acid generator thereto by 2 wt % against 100 wt % of resin polymer. The resultant solution was filtered with a 0.2 μm filter to prepare an Si-based resist solution having a solid content of 10 wt %.

An 8 inch silicon wafer which had already been coated with a novolak resist (Microprosite 1350, produced by Shipley) layer of 670 nm thick was spin-coated with the above-prepared resist solution at 3000 rpm. The spin-coated silicon wafer was subjected to prebake on a hotplate at 100° C. for 60 seconds to obtain a film of 100 nm thick. The thus obtained Si-based resist film was exposed by an ArF excimer stepper (NA=0.55, produced by Nikon), subjected to PEB at 90° C. for 60 seconds, developed by a 2.38% TMAH solution for 60 seconds and then rinsed with water. As a result, the Si-based resist material showed a positive-type characteristic and attained a resolution of 0.12 μm wide of line and space by 7 mJ/cm$^2$ of exposure (sensitivity). Thereafter, oxygen plasma processing was performed using this pattern as a mask to allow the pattern to be transferred to a lower layer novolak resin. As a result, a resolution of 0.11 μm wide of line and space having an aspect ratio of 4.7 was able to be obtained without scum.

EXAMPLE 13

Resist Resin Comprising Mixture of A-10 and B-8 (Si Content Being 10%)

127.4 g of PGMEA was added to 10.2 g of the polyorganosilsesquioxane resin solution A-10 (solid content being 37%) prepared in Synthesis Example 17 and 57.8 g of the acrylic copolymer resin B-8 (solid content being 20%) prepared in Synthesis Example 19 and then triphenylsulfonium hexafluoroantimonate was added as an acid generator thereto by 2 wt % against 100 wt % of resin polymer. The resultant solution was filtered with a 0.2 μm filter to prepare an Si-based resist solution having a solid content of 10 wt %.

An 8 inch silicon wafer which had already been coated with a novolak resist (Microprosite 1350, produced by Shipley) layer of 670 nm thick was spin-coated with the above-prepared resist solution at 3000 rpm. The spin-coated silicon wafer was subjected to prebake on a hotplate at 100° C. for 60 seconds to obtain a film of 100 nm thick. The thus obtained Si-based resist film was exposed by an ArF excimer stepper (NA=0.55, produced by Nikon), subjected to PEB at 90° C. for 60 seconds, developed by a 2.38% TMAH solution for 60 seconds and then rinsed with water. As a result, the Si-based resist material showed a positive-type characteristic and attained a resolution of 0.12 μm wide of line and space by 5 mJ/cm$^2$ of exposure (sensitivity). Thereafter, oxygen plasma processing was performed using this pattern as a mask to allow the pattern to be transferred to a lower layer novolak resin. As a result, a resolution of 0.12 μm wide of line and space having an aspect ratio of 5.5 was able to be obtained without scum.

EXAMPLE 14

Resist Resin Comprising Mixture of A-11 and B-5 (Si Content Being 10%)

127.4 g of PGMEA was added to 13.4 g of the polyorganosilsesquioxane resin solution A-11 (solid content being 37%) prepared in Synthesis Example 18 and 57.8 g of the acrylic copolymer resin B-5 (solid content being 20%) prepared in Synthesis Example 12 and then triphenylsulfonium hexafluoroantimonate was added as an acid generator thereto by 2 wt % against 100 wt % of resin polymer. The resultant solution was filtered with a 0.2 μm filter to prepare an Si-based resist solution having a solid content of 10 wt %.

An 8 inch silicon wafer which had already been coated with a novolak resist (Microprosite 1350, produced by Shipley) layer of 670 nm thick was spin-coated with the above-prepared resist solution at 3000 rpm. The spin-coated silicon wafer was subjected to prebake on a hotplate at 100° C. for 60 seconds to obtain a film of 100 nm thick. The thus obtained Si-based resist film was exposed by an ArF excimer stepper (NA=0.55, produced by Nikon), subjected to PEB at 90° C. for 60 seconds, developed by a 2.38% TMAH solution for 60 seconds and then rinsed with water. As a result, the Si-based resist material attained a resolution of 0.12 μm wide of line and space by 10 mJ/cm² of exposure (sensitivity). Thereafter, oxygen plasma processing was performed using this pattern as a mask to allow the pattern to be transfered to a lower layer novolak resin. As a result, a resolution of 0.12 μm wide of line and space having an aspect ratio of 4.4 was able to be obtained without scum.

Comparative Example 1

Resist Resin Comprising Methacrylic Copolymer Having an Alicylic Alkyl Group

Triphenylsulfonium hexafluoroantimonate was added as an acid generator to the methacrylic copolymer B-9 (a solution with a solid content of 20 wt %) having an alicylic alkyl group prepared in Synthesis Example 20 by 1 wt % against 100 wt % of resin polymer and then filtered with a 0.2 μm filter to prepare a resist solution.

A silicon wafer was spin-coated with this solution thereon at 3000 rpm. The spin-coated silicon wafer was subjected to prebake on a hotplate at 110° C. for 90 seconds. The film obtained had thickness of 480 nm.

After thus obtained resist film on the wafer was exposed by an ArF excimer stepper (NA=0.55), it was subjected to PEB at 120° C. for 90 seconds. Succeedingly, it was developed by a 2.38% TMAH solution for 60 seconds and then rinsed with water for 30 seconds. As a result, the resist material of the present invention showed a positive-type characteristic and attained a resolution of 0.17 μm wide of line & space (L&S) by 15 mJ/cm² of exposure (sensitivity). When Ar plasma etching resistance of this time was compared with a conventional novolak-type resist (Microprosite 1350, produced by Shipley), a relative etching rate was 1.5.

Comparative Example 2

Resist Resin Comprising Tert-butylated Polyhydroxycarbonylethylsilsesquioxane 20.0 g of PGMEA solvent was first added to 20.0 g of tert-butylated polyhydroxycarbonylethylsilsesquioxane resin solution A-12 (solid content being 20%) prepared in Synthesis Example 21 and then triphenylsulfonium hexafluoroantimonate was added as an acid by 2 wt % against 100 wt % of resin polymer and then filtered with a 0.2 μm filter to prepare an Si-based resist solution having a solid content of 10 wt %.

An 8-inch silicon wafer which had already been coated with a novolak resist (Microprosite 1350, produced by Shipley) layer of 670 nm thick was spin-coated with this solution thereon at 3000 rpm; the thus spin-coated silicon wafer was subjected to prebake on a hotplate at 110° C. for 90 seconds. The film obtained had thickness of 100 nm. After thus obtained resist film on the wafer was exposed by an ArF excimer stepper (NA=0.55), it was subjected to PEB at 90° C. for 60 seconds. Succeedingly, it was developed by a 2.38% TMAH solution for 60 seconds and then rinsed with water. As a result, the resist material of the present invention showed a positive-type characteristic by 20 mJ/cm² of exposure (sensitivity). However, it was not capable of attaining a resolution of fine line width of line & space becase of the solubility to a 2.38% TMAH developer is too high. Therefore, when oxygen plasma processing was performed using this pattern as a mask, the pattern was unable to be transfered to a lower novolak resin.

Evaluation results of line & space resolutions in the above-described Examples and Comparative Examples are shown in Table 1

TABLE 1

| No. | Base Resin | Resolution (μm) | Sensitivity (mJ/cm²) |
|---|---|---|---|
| Example 1 | B-1 | 0.14 | 5 |
| Example 2 | B-2 | 0.13 | 6 |
| Example 3 | B-3 | 0.14 | 6 |
| Example 4 | B-4 | 0.15 | 9 |
| Example 5 | A-4 + B-5 | 0.13 | 5 |
| Example 6 | A-5 + B-6 | 0.14 | 10 |
| Example 7 | A-6 + B-7 | 0.14 | 7 |
| Example 8 | A-4 + B-5 | 0.12 | 5 |
| Example 9 | A-7 + B-5 | 0.15 | 10 |
| Example 10 | A-8 + B-5 | 0.15 | 5 |
| Example 11 | A-9 + B-5 | 0.14 | 10 |
| Example 12 | A-10 + B-5 | 0.11 | 7 |
| Example 13 | A-10 + B-8 | 0.12 | 5 |
| Example 14 | A-11 + B-5 | 0.12 | 10 |
| Comparative Example 1 | B-9 | 0.17 | 15 |
| Comparative Example 2 | A-12 | — | 20 |

INDUSTRIAL APPLICABILITY

A resist resin composition of the present invention has a high sensitivity (for example, quantity of exposure being 10 mJ/cm² or less with ArF exposure) when exposed by light having a wavelength of 220 nm or less (ArF laser: 193 nm, F₂ laser: 157 nm, Ar₂ laser: 121 nm, a soft ray: 13 nm or the like), an electron beam or X-ray and can form a satisfactory pattern with a line & space of 0.15 μm or less when adapted to a two-layer resist process. Therefore, the resist resin composition of the present invention is greatly valued in the ultrafine processing technology in the semiconductor industry.

What is claimed is:

1. A resist resin comprising
a copolymer in which a polyorganosilsesquioxane structure and a (meth)acrylic-based polymer structure having a side chain decomposable with an acid to generate an organic acid group are present in one molecule, or
a mixture of (co)polymers in which said structures are each present in different molecules,
wherein the polyorganosilsesquioxane structure is represented by formula (1):

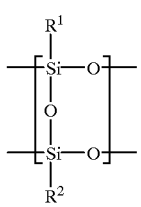

(1)

wherein $R^1$ and $R^2$, which may be the same or different, each represent a hydrocarbon group having 1 to 10 carbon atom(s) which may be substituted with a (meth)acryloyloxy, vinyl, amino, epoxy or mercapto group, said (meth)acryloyloxy and vinyl group may form (meth)acrylic-based or vinyl-based polymer structures respectively, and a plurality of $R^1$ or $R^2$ present in the same molecule may be different from each other.

2. The resist resin according to claim 1, comprising a copolymer comprising a (meth)acrylic- or vinyl-based polymer structure derived from a group represented by formula (2):

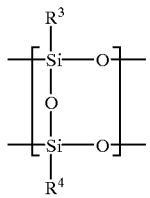

(2)

wherein $R^3$ and $R^4$ represent the same meaning as the $R^1$ and $R^2$ described in claim 1 respectively, and at least one of $R^3$ and $R^4$ represents a hydrocarbon group having 1 to 10 carbon atom(s) substituted with a (meth)acryloyloxy or vinyl group, and a (meth)acrylic-based polymer structure having a side chain decomposable with an acid to generate an organic acid group.

3. The resist resin according to claim 2, wherein said copolymer comprises the (meth)acrylic- or vinyl-based polymer structure derived from the formula (2), a (meth)acrylic polymer structure represented by formula (3):

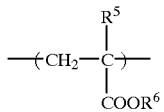

(3)

wherein $R^5$ represents a hydrogen atom or a methyl group and $R^6$ represents a group decomposable with an acid, and a (meth)acrylic polymer structure represented by formula (4):

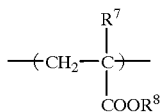

(4)

wherein $R^7$ represents a hydrogen atom or a methyl group and $R^8$ represents a hydrogen atom or an alkyl group having 1 to 10 carbon atom(s).

4. The resist resin according to claim 3, wherein said copolymer comprises 1 to 50 mol % of a (meth)acrylic- or vinyl-based polymer structure derived from the group represented by the formula (2), 10 to 90 mol % of the (meth)acrylic-based polymer structure represented by the formula (3), 1 to 90 mol % of the (meth)acrylic-based polymer structure represented by the formula (4) and 50 mol % or less of a polymer structure represented by formula (5):

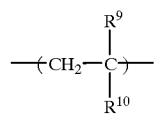

(5)

wherein $R^9$ represents a hydrogen atom or a methyl group and $R^{10}$ represents an organic, a hydroxyl, a sulfonic acid group or a halogen atom.

5. The resist resin according to any one of claims 2 to 4, wherein 0.1 mol % or more of silanol terminals of a polymer structure derived from a group represented by the formula (2) is endcapped.

6. The resist resin according to claim 5, wherein 50 mol % or more of silanol terminals of a polymer structure derived from the group represented by the formula (2) is endcapped.

7. The resist resin according to claim 2, wherein the (meth)acrylic- or vinyl-based polymer structure derived from the group represented by the formula (2) comprises a ladder structure having a partially branched structure represented by formula (6):

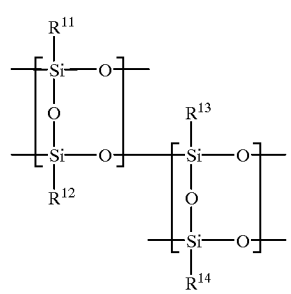

(6)

wherein $R^{11}$, $R^{12}$, $R^{13}$ and $R^{14}$ represent the same meaning as $R^1$ and $R^2$ described in claim 1 and at least one of $R^{11}$, $R^{12}$, $R^{13}$ and $R^{14}$ represents a hydrocarbon group having 1 to 10 carbon atom(s) substituted by a (meth)acryloyloxy or vinyl group.

8. The resist resin according to claim 1, comprising a mixture of polyorganosilsesquioxane having the structure represented by the formula (1) and a (co)polymer comprising a (meth)acrylic-based polymer structure having a side chain group decomposable with an acid to generate an organic acid group.

9. The resist resin according to claim 8, comprising a mixture of a polyorganosilsesquioxane having the structure represented by the formula (1), a (meth)acrylic-based polymer structure represented by formula (7):

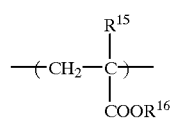

(7)

wherein $R^{15}$ represents a hydrogen atom or a methyl group and $R^{16}$ represents a group which is decomposable with an acid, and a (meth)acrylic-based polymer structure represented by formula (8):

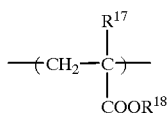

(8)

wherein $R^{17}$ represents a hydrogen atom or a methyl group and $R^{18}$ represents a hydrogen atom or an alkyl group having 1 to 10 carbon atom(s).

10. The resist resin according to claim 9, wherein said copolymer comprises 10 to 90 mol % of the (meth)acrylic-based polymer structure represented by the formula (7), 1 to 90 mol % of the (meth)acrylic-based polymer structure represented by the formula (8) and 50 mol % or less of a polymer structure represented by formula (9):

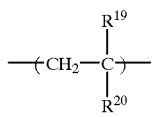

(9)

wherein $R^{19}$ represents a hydrogen atom or a methyl group and $R^{20}$ represents an organic, a hydroxyl, a sulfonic acid group or a halogen atom.

11. The resist resin according to claim 10, wherein the polymer structure represented by said formula (9) comprises 100 mol % or less of a (meth)acrylic-based or vinyl-based polymer structure derived from a group represented by formula (10):

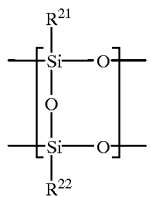

(10)

wherein $R^{21}$ and $R^{22}$ represent the same meanings as $R^1$ and $R^2$ described in claim 1 respectively and at least one of $R^{21}$ and $R^{22}$ represents a hydrocarbon group having 1 to 10 carbon atom(s) substituted by a (meth) acyloyloxy or vinyl group.

12. The resist resin according to any one of claims 8 to 11, wherein 0.1 mol % or more of silanol terminals of polyorganosilsesquioxane having the structure represented by the formula (1) and the polymer structure derived from the group represented by the formula (10) are endcapped.

13. The resist resin according to claim 12, wherein 50 mol % or more of silanol terminals of polyorganosilsesquioxane having the structure represented by the formula (1) and the polymer structure derived from the group represented by the formula (10) are endcapped.

14. The resist resin according to claim 8, wherein polyorganosilsesquioxane having the structure represented by the formula (1) comprises a ladder structure having a partially branched structure represented by formula (11):

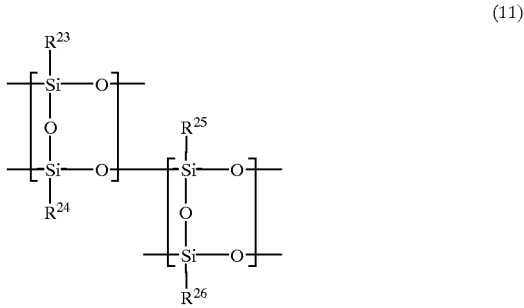

(11)

wherein $R^{23}$, $R^{24}$, $R^{25}$ and $R^{26}$ represent the same meanings as $R^1$ and $R^2$ described in claim 1.

15. The resist resin according to claim 1, to wherein silicon (Si) content rate is 1 to 30 wt %.

16. A resist resin composition comprising a resist resin according to claim 1 and a light-causing acid generator decomposable by exposure of light having a wavelength of 220 nm or less, an electron beam or X-ray to generate an acid.

17. A method of forming a pattern on a substrate to be processed comprising the steps of:
    forming a resist layer comprising the resist resin composition according to claim 16 on the substrate to be processed;
    performing a preheating operation;
    performing exposure of light having a wavelength of 220 nm or less, an electron beam or X-ray via photomask;
    performing a heating operation; and
    performing development.

18. A method of forming a pattern comprising the steps of:
    forming an organic polymer compound on a substrate to be processed as a lower layer resist;
    constructing a two-layer structure by forming the resist resin composition according to claim 16 on said lower layer resist as a upper layer resist;
    exposing said upper layer resist with light having a wavelength of 220 nm or less, an electron beam or X-ray via photomask;
    performing a heating operation;
    performing development; and
    performing etching using the upper layer resist-pattern as a mask so as to transfer to the lower layer resist.

* * * * *